(12) United States Patent
Shirota et al.

(10) Patent No.: US 12,183,391 B2
(45) Date of Patent: Dec. 31, 2024

(54) SEMICONDUCTOR MEMORY DEVICE AND MANUFACTURING METHOD OF SEMICONDUCTOR MEMORY DEVICE

(71) Applicant: Unisantis Electronics Singapore Pte. Ltd., Singapore (SG)

(72) Inventors: Riichiro Shirota, Hsinchu (TW); Nozomu Harada, Tokyo (JP); Koji Sakui, Tokyo (JP); Masakazu Kakumu, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 253 days.

(21) Appl. No.: 17/981,634

(22) Filed: Nov. 7, 2022

(65) Prior Publication Data

US 2023/0145678 A1  May 11, 2023

(30) Foreign Application Priority Data

Nov. 9, 2021 (WO) .................. PCT/JP2021/041085

(51) Int. Cl.
*G11C 11/4097* (2006.01)
*G11C 11/408* (2006.01)
*H10B 12/00* (2023.01)

(52) U.S. Cl.
CPC ...... *G11C 11/4097* (2013.01); *G11C 11/4085* (2013.01); *H10B 12/20* (2023.02)

(58) Field of Classification Search
CPC ............ G11C 11/4097; G11C 11/4085; G11C 11/404; G11C 2211/4016; H10B 12/20; H10B 12/33; H10B 12/01
See application file for complete search history.

(56) References Cited

U.S. PATENT DOCUMENTS

| 6,603,168 B1 | 8/2003 | Choi |
| 2003/0111681 A1 | 7/2003 | Kawanaka |

(Continued)

FOREIGN PATENT DOCUMENTS

| JP | H 02-188966 A | 7/1990 |
| JP | H 03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Allison Bernstein
(74) *Attorney, Agent, or Firm* — Crowell & Moring LLP

(57) ABSTRACT

A dynamic flash memory is formed by stacking, on a first impurity layer on a P-layer substrate, a first insulating layer, a first material layer, a second insulating layer, a second material layer, a third insulating layer, a third material layer, and a fourth material layer, forming a first hole penetrating these layers on the P-layer substrate, forming a semiconductor pillar by embedding the first hole with a semiconductor, removing the first, second, and third material layers to form second, third, and fourth holes, by oxidizing an outermost surface of the semiconductor pillar exposing in the second, third, and fourth holes to form first, second, and third gate insulating layers, and forming first, second, and third gate conductor layers embedded in the second, third, and fourth holes.

7 Claims, 24 Drawing Sheets

(56) References Cited

U.S. PATENT DOCUMENTS

| | | | |
|---|---|---|---|
| 2006/0157738 A1 | 7/2006 | Kawanaka | |
| 2008/0137394 A1 | 6/2008 | Shimano et al. | |
| 2008/0277738 A1 | 11/2008 | Ananthan | |
| 2009/0121271 A1 | 5/2009 | Son et al. | |
| 2012/0161229 A1 | 6/2012 | Kwon et al. | |
| 2022/0367467 A1* | 11/2022 | Harada | H10B 12/20 |
| 2023/0186966 A1* | 6/2023 | Shirota | H10B 99/22 |
| | | | 365/184 |

FOREIGN PATENT DOCUMENTS

| | | |
|---|---|---|
| JP | 2001-308203 A | 11/2001 |
| JP | 2003-188279 A | 7/2003 |
| JP | 2008-147514 A | 6/2006 |
| JP | 3957774 B2 | 5/2007 |
| JP | 2009-117843 A | 5/2009 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transactions on Electron Devices, pp. 1-9 (2015).

M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Paper, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4, pp. 765-771 (2007).

International Search Report (PCT/ISA/210) (Japanese) from PCT/JP2021/041085 dated Feb. 1, 2022, 3 pgs.

International Written Opinion (PCT/ISA/237) (Japanese) from PCT/JP2021/041085 dated Feb. 1, 2021, 4 pgs.

* cited by examiner

FIG. 2A "1" WRITE STATE

FIG. 2B "0" ERASE OPERATION

FIG. 3A "1" WRITE OPERATION SOURCE-SIDE IMPACT IONIZATION

FIG. 3B "1" WRITE STATE

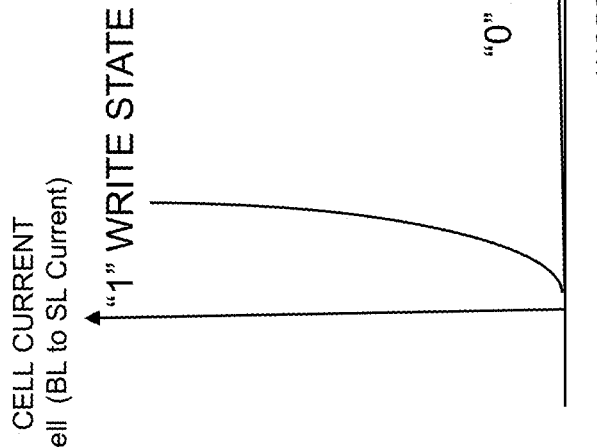
FIG. 4AC
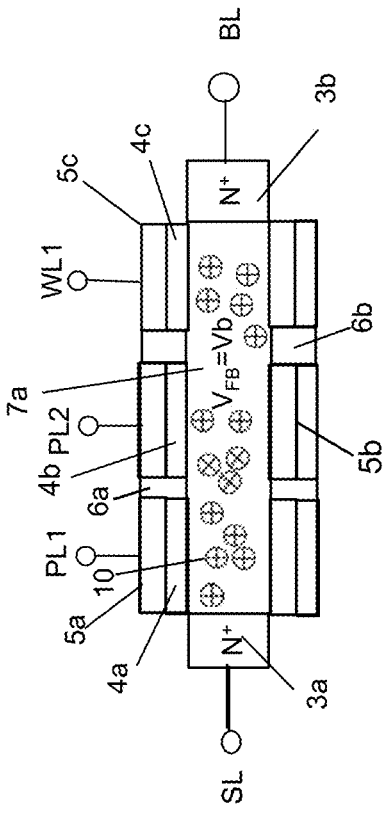
FIG. 4AA  "1" WRITE STATE
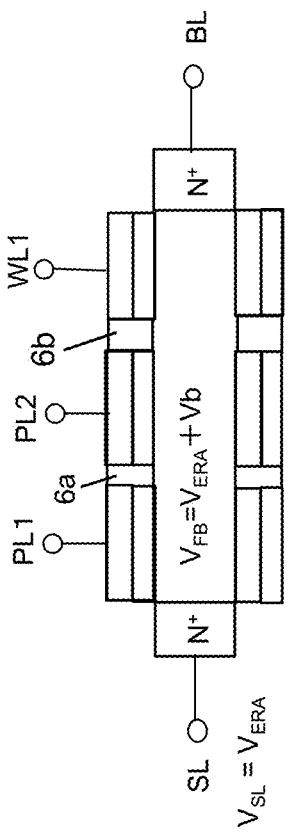
FIG. 4AB  "0" ERASE STATE
Vb: BUILT-IN VOLTAGE ~0.7V BL: BIT LINE
SL: SOURCE LINE
WL: WORD LINE
PL1: FIRST PLATE LINE
PL2: SECOND PLATE LINE
FB: FLOATING BODY $C_{FB} = C_{PL1} + C_{PL2} + C_{WL} + C_{BL} + C_{SL}$ $$\Delta V_{FB} = V_{FB2} - V_{FB1}$$
$$= \frac{C_{WL}}{C_{PL} + C_{WL} + C_{BL} + C_{SL}} \times V_{ReadWL} \quad (4)$$
$$C_{PL} = C_{PL1} + C_{PL2}$$

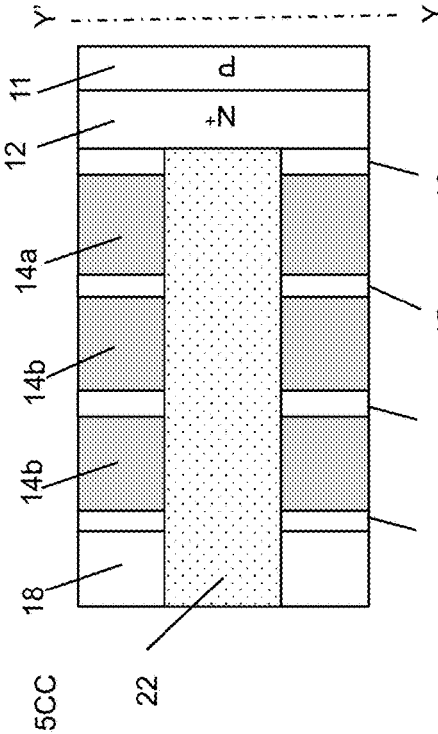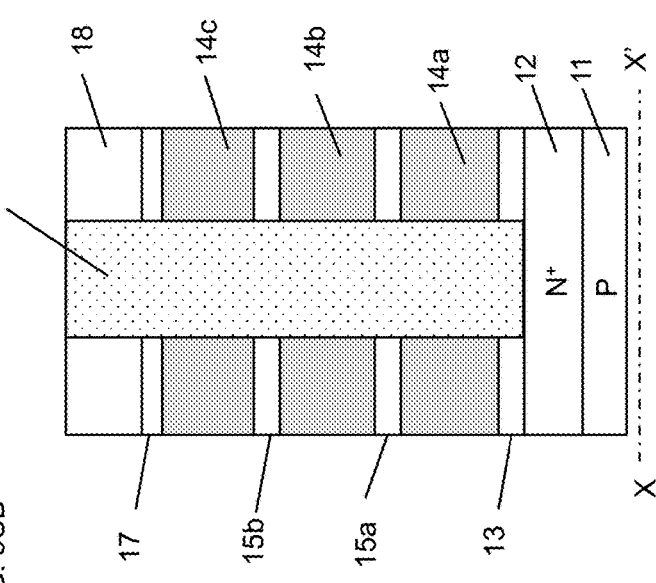

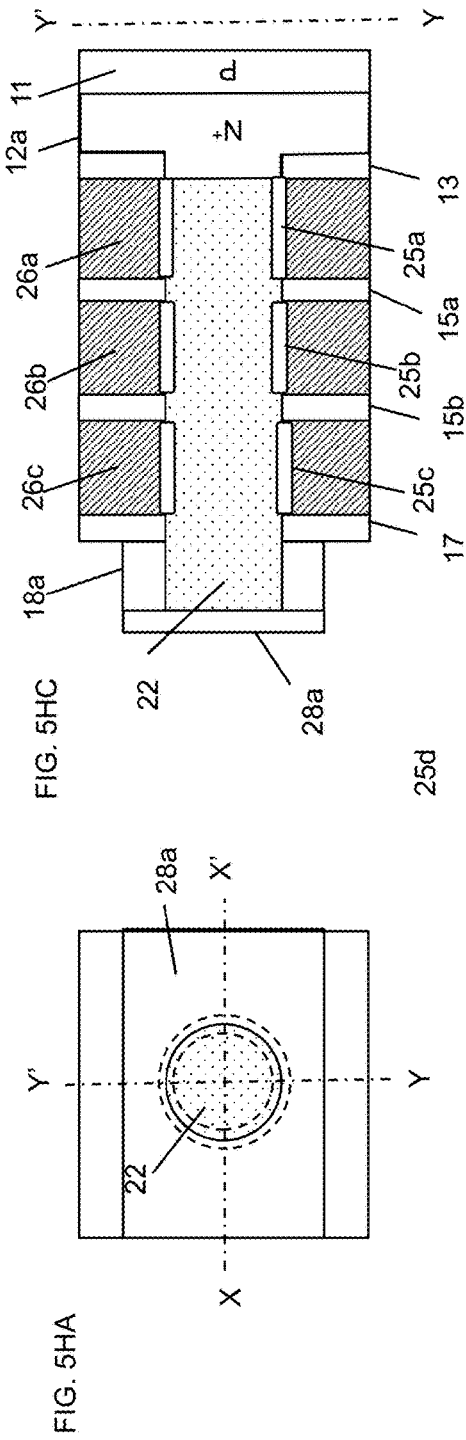
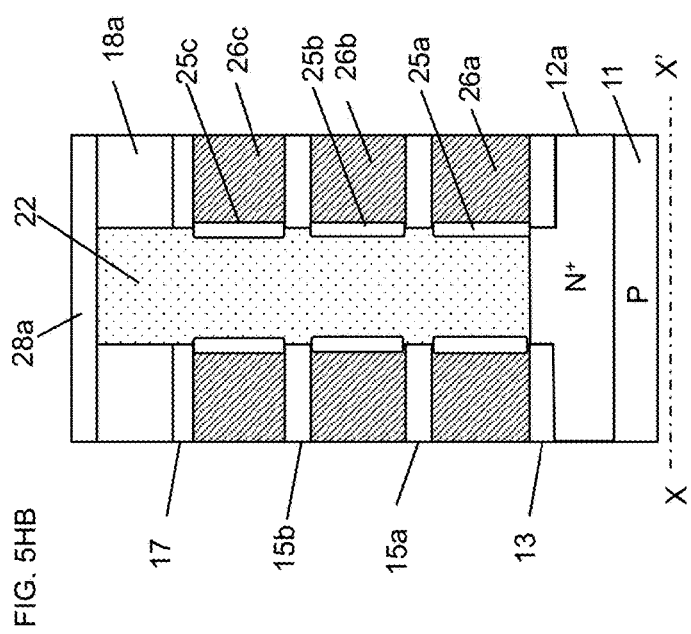
FIG. 5HA
FIG. 5HB
FIG. 5HC

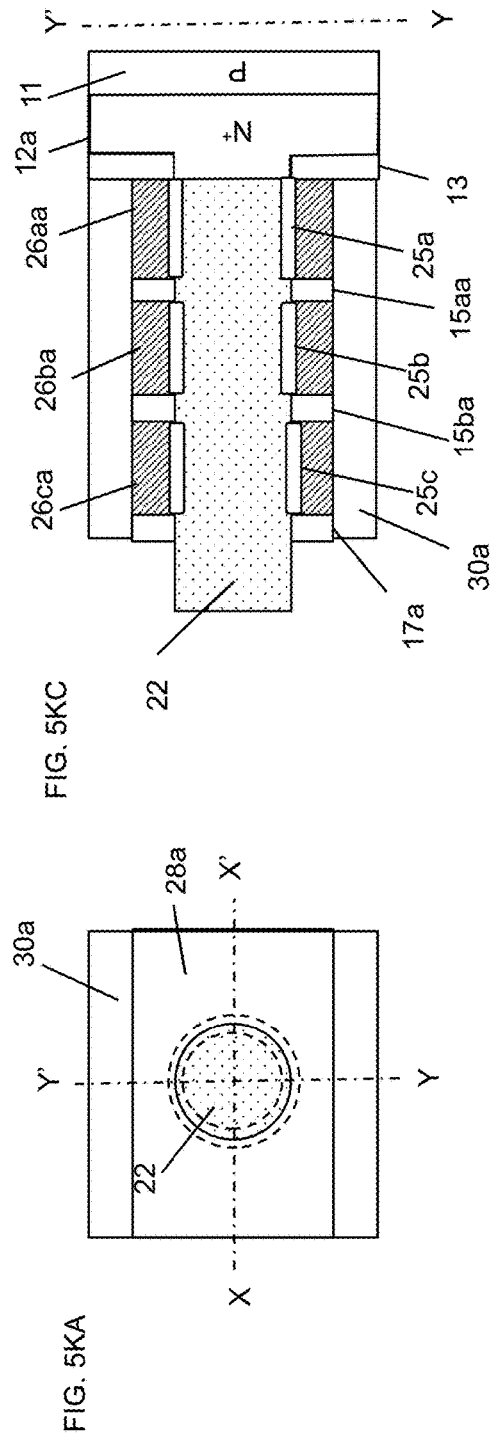

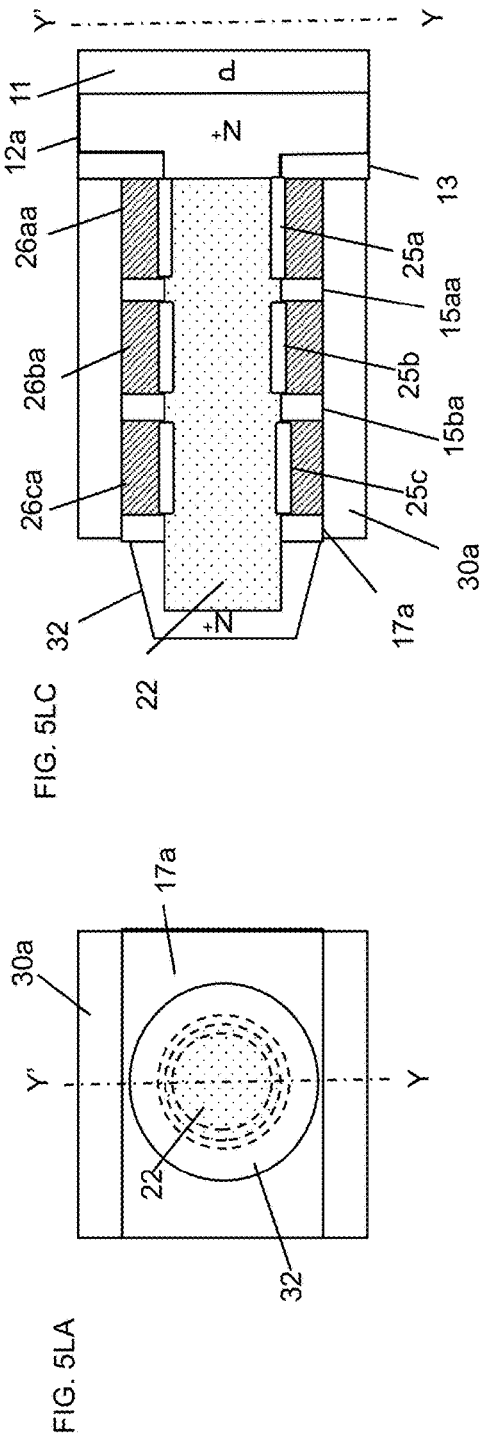
FIG. 5LC
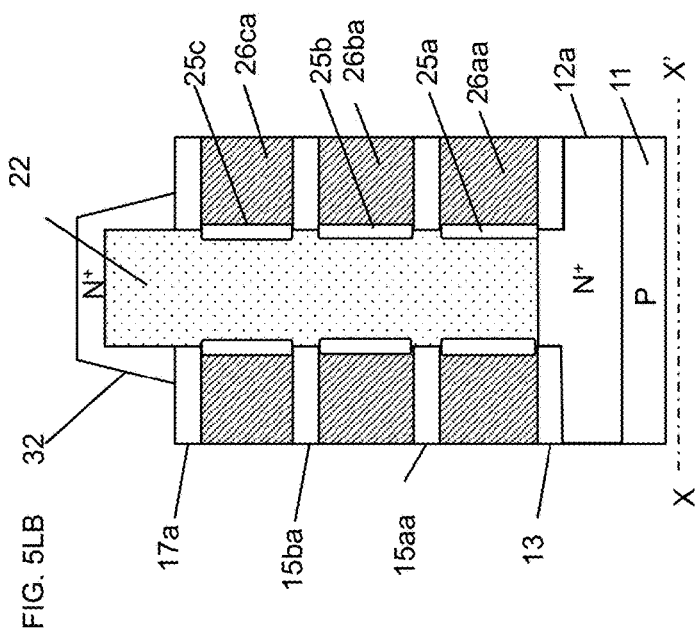
FIG. 5LA
FIG. 5LB

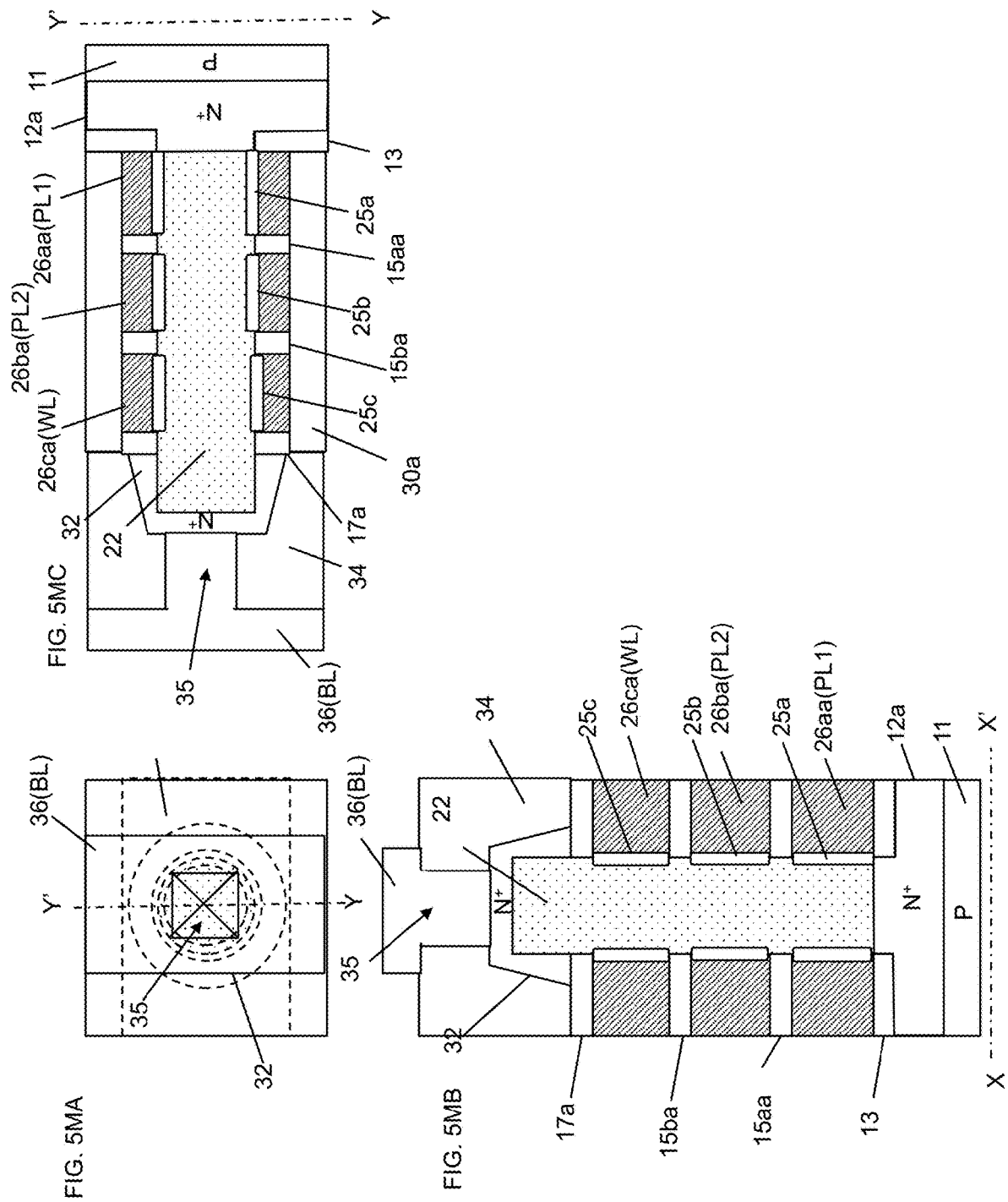

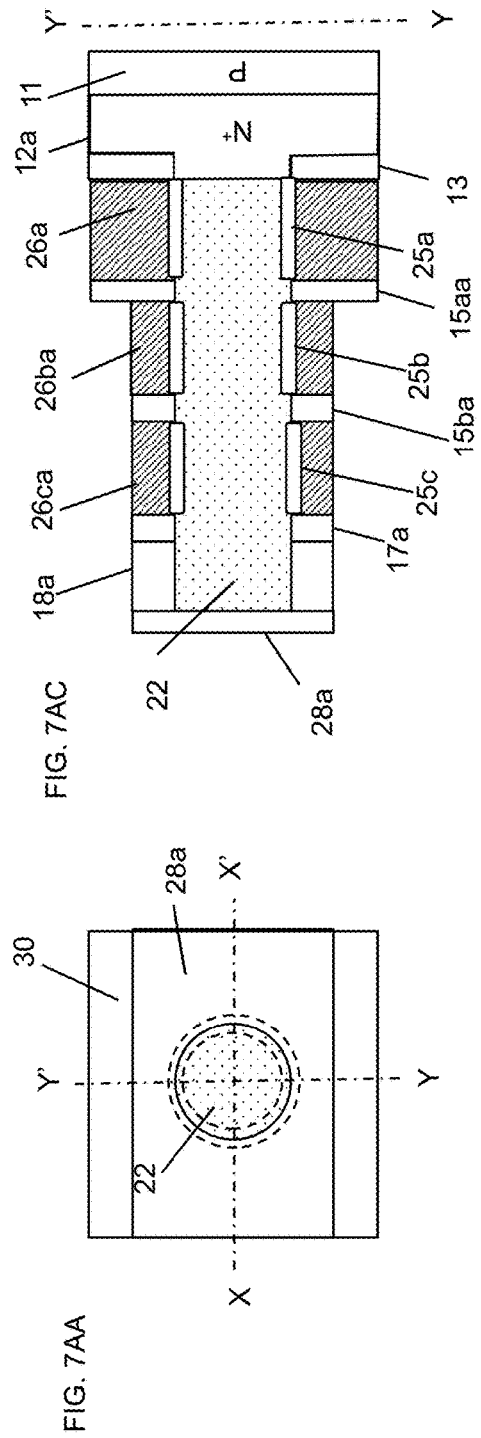
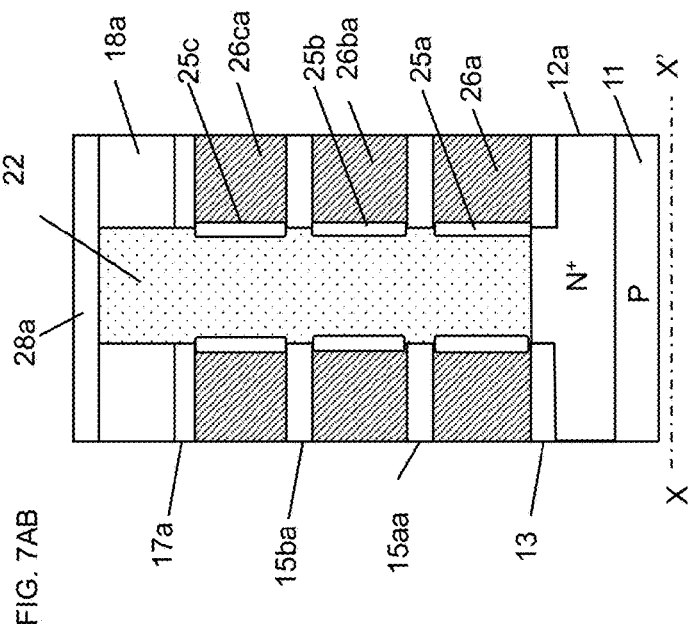
FIG. 7AC
FIG. 7AA
FIG. 7AB

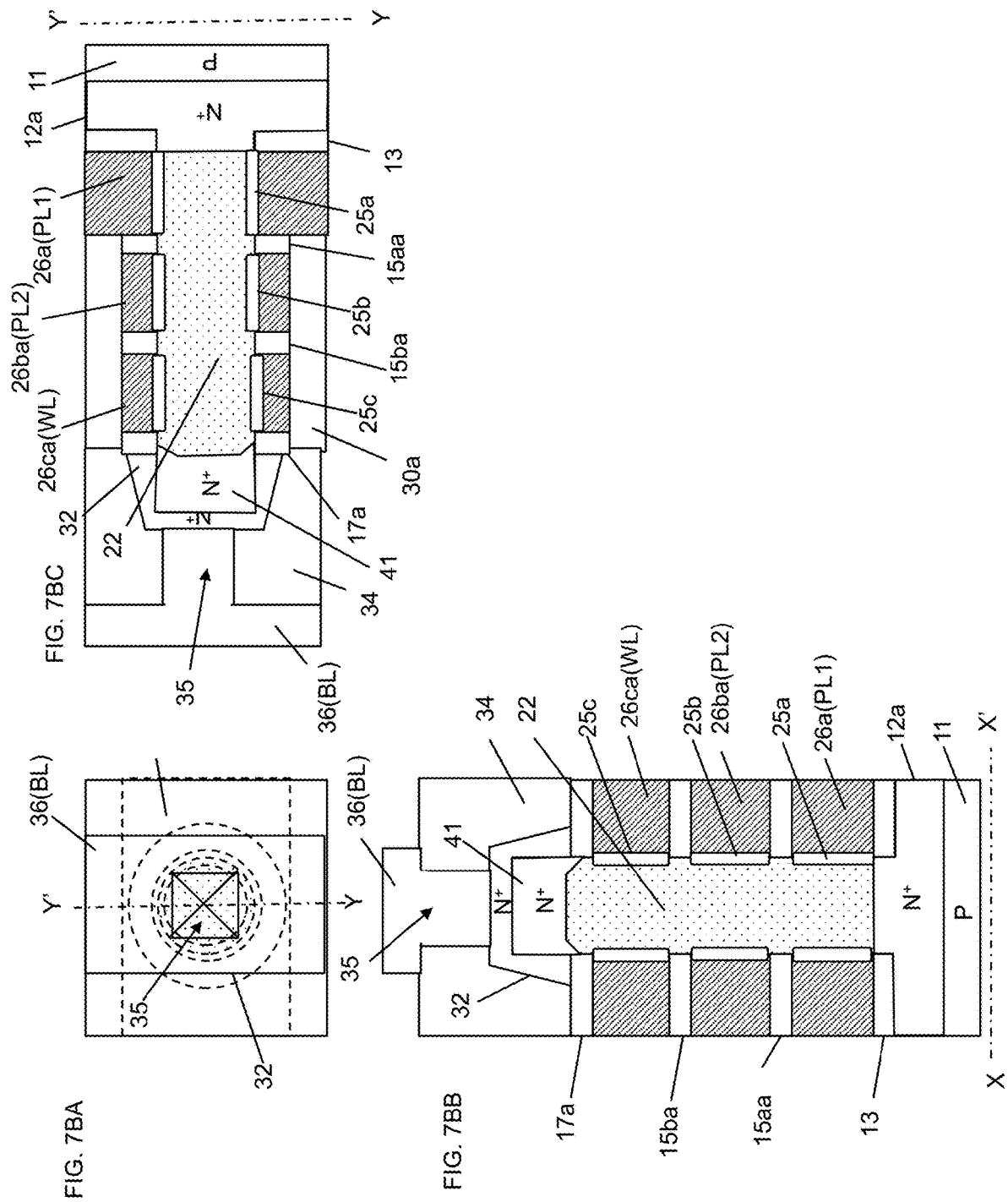

$$C_{FB} = C_{WL} + C_{BL} + C_{SL} \quad \text{EQUATION (1)}$$

$V_{WL}$ — $V_{ProgWL}$, 0V, 0V $V_{FB}$ — $V_{FB1}$, $V_{FB2}$, $V_{FB1}$, $\Delta V_{FB}$ $$\Delta V_{FB} = V_{FB2} - V_{FB1}$$

$$= \frac{C_{WL}}{C_{WL} + C_{BL} + C_{SL}} \times V_{ProgWL} \quad \text{EQUATION (2)}$$

$$\beta = \frac{C_{WL}}{C_{WL} + C_{BL} + C_{SL}} \quad \text{EQUATION (3)}$$

SEMICONDUCTOR MEMORY DEVICE AND MANUFACTURING METHOD OF SEMICONDUCTOR MEMORY DEVICE

CROSS-REFERENCE TO RELATED APPLICATIONS

This application claims priority to PCT/JP2021/041085, filed Nov. 9, 2021, the entire content of which is incorporated herein by reference.

BACKGROUND OF THE INVENTION

1. Field of the Invention

The present invention relates to a semiconductor memory device and a manufacturing method of the semiconductor memory device.

2. Description of the Related Art

In recent years, there has been a demand for a memory element having a higher degree of integration and a higher performance in the development of the large scale integration (LSI) technology.

Typical planar metal-oxide-semiconductor (MOS) transistors have a channel that extends in a horizontal direction along the upper surface of a semiconductor substrate. In contrast, surrounding gate transistors (SGTs) have a channel that extends in a direction perpendicular to the upper surface of a semiconductor substrate (refer to, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, SGTs enable an increase in the density of semiconductor devices compared with planar MOS transistors. Such SGTs can be used as selection transistors to achieve a higher degree of integration of a dynamic random access memory (DRAM) (refer to, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)) to which a capacitor is connected, a phase change memory (PCM) (refer to, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No. 12, December, pp. 2201-2227 (2010)) to which a resistance-change element is connected, a resistive random access memory (RRAM) (refer to, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)), a magneto-resistive random access memory (MRAM) (refer to, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)) in which the orientation of magnetic spins is changed with a current to change the resistance, and the like. Furthermore, there is a DRAM memory cell (refer to M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)) that is constituted by a single MOS transistor and that includes no capacitor. The present application relates to a dynamic flash memory that can be constituted only by a MOS transistor and that includes neither a resistance-change element nor a capacitor.

FIGS. 8A to 8D illustrate a write operation of the above-mentioned DRAM memory cell constituted by a single MOS transistor and including no capacitor, FIGS. 9A and 9B illustrate a problem in the operation thereof, and FIGS. 10A to 10C illustrate a read operation thereof.

FIGS. 8A to 8D illustrate the write operation of the DRAM memory cell. FIG. 8A illustrates a "1" write state. Here, the memory cell is formed in a silicon on insulator (SOI) substrate 100 and constituted by a source $N^+$ layer 103 (hereinafter, a semiconductor region including a donor impurity at a high concentration will be referred to as "$N^+$ layer") to which a source line SL is connected, a drain $N^+$ layer 104 to which a bit line BL is connected, a gate conductor layer 105 to which a word line WL is connected, and a floating body 102 of a memory cell 100a, which is a MOS transistor. The DRAM memory cell is constituted by the single memory cell 110a and includes no capacitor. Note that a $SiO_2$ layer 101 of the SOI substrate is in contact with the floating body 102 directly under the floating body 102. At the time of writing "1" in the memory cell constituted by the single memory cell 110a, the memory cell 110a is operated in the saturation region. That is, a channel 107 for electrons extending from the source $N^+$ layer 103 has a pinch-off point P and does not reach the drain $N^+$ layer 104 to which the bit line BL is connected. In this manner, when both the bit line BL connected to the drain $N^+$ layer 104 and the word line WL connected to the gate conductor layer 105 are set at high voltages, and the memory cell 110a is operated at a gate voltage that is about ½ of the drain voltage, the electric field strength becomes maximum at the pinch-off point P near the drain $N^+$ layer 104. As a result, accelerated electrons flowing from the source $N^+$ layer 103 toward the drain $N^+$ layer 104 collide with the lattice of Si, and electron-hole pairs are generated by the kinetic energy lost at this time (impact ionization phenomenon). Most of the generated electrons (not illustrated) reach the drain $N^+$ layer 104. Only a small number of very hot electrons jump over a gate oxide film 109 and reach the gate conductor layer 105. Holes 106 that have been generated at the same time charge the floating body 102. In this case, the generated holes contribute to an increment of the majority carrier because the floating body 102 is P-type Si. When the floating body 102 is filled with the generated holes 106 and the voltage of the floating body 102 becomes higher than that of the source $N^+$ layer 103 by Vb or more, holes that are further generated are discharged to the source $N^+$ layer 103. Here, Vb is a built-in voltage of the PN junction between the floating body 102 of a P layer and the source $N^+$ layer 103, and is about 0.7 V. FIG. 8B illustrates a state in which the floating body 102 is charged to saturation with the generated holes 106.

Next, a "0" write operation of a memory cell 110b will be described with reference to FIG. 8C. The memory cell 110a in which "1" is written and the memory cell 110b in which "0" is written are present at random with respect to a common selected word line WL. FIG. 8C illustrates a state in which a "1" write state is rewritten to a "0" write state. At the time of writing "0", the voltage of the bit line BL is set to a negative bias, and the PN junction between the floating body 102 of the P layer and the drain $N^+$ layer 104 is forward biased. As a result, the holes 106 that are generated in advance in the floating body 102 in the previous cycle flow into the drain N⁺ layer 104 connected to the bit line BL. Upon completion of the write operation, a state of two memory cells, which are the memory cell 110a filled with the generated holes 106 (FIG. 8B) and the memory cell 110b in which the generated holes are discharged (FIG. 8C), is obtained. The potential of the floating body 102 of the memory cell 110a filled with the holes 106 becomes higher than that of the floating body 102 in which the generated holes are not present. Accordingly, the threshold voltage of the memory cell 110a becomes lower than the threshold voltage of the memory cell 110b. This state is illustrated in FIG. 8D.

Next, a problem in the operation of the memory cell constituted by the single MOS transistor will be described with reference to FIGS. 9A and 9B. As illustrated in FIG. 9A, a capacitance $C_{FB}$ of the floating body 102 is the sum of a capacitance $C_{WL}$ between the gate to which the word line is connected and the floating body 102, a junction capacitance $C_{SL}$ of the PN junction between the floating body 102 and the source N⁺ layer 103 to which the source line is connected, and a junction capacitance $C_{BL}$ of the PN junction between the floating body 102 and the drain N⁺ layer 104 to which the bit line is connected, and is expressed as follows.

$$C_{FB}=C_{WL}+C_{BL}+C_{SL} \quad (1)$$

Accordingly, when a word line voltage $V_{WL}$ swings at the time of reading or at the time of writing, the voltage of the floating body 102 serving as a storage node (contact point) of the memory cell is also affected by this swing. This state is illustrated in FIG. 9B. When the word line voltage $V_{WL}$ increases from 0 V to $V_{ProgWL}$ at the time of writing, a voltage $V_{FB}$ of the floating body 102 is increased from a voltage $V_{FB1}$ in the initial state before the change in the word line voltage to $V_{FB2}$ by a capacitive coupling with the word line. A voltage change amount $\Delta V_{FB}$ is expressed as follows.

$$\begin{aligned}\Delta V_{FB} &= V_{FB2} - V_{FB1} \\ &= C_{WL}/(C_{WL} + C_{BL} + C_{SL}) \times V_{ProgWL}\end{aligned} \quad (2)$$

Here, β is a coupling ratio.

$$\beta=C_{WL}/(C_{WL}+C_{BL}+C_{SL}) \quad (3)$$

In such a memory cell, $C_{WL}$ has a large contribution ratio, and, for example, $C_{WL}:C_{BL}:C_{SL}=8:1:1$. In this case, β=0.8. When the word line changes, for example, from 5 V at the time of writing to 0 V after completion of writing, the floating body 102 is subjected to an amplitude noise of as large as 5 V×β=4 V due to the capacitive coupling between the word line and the floating body 102. Accordingly, there has been a problem in that a potential difference margin is not provided sufficiently between the "1" potential and the "0" potential of the floating body 102 at the time of writing.

FIGS. 10A to 10C illustrate a read operation. FIG. 10A illustrates the "1" write state, and FIG. 10B illustrates the "0" write state. Actually, however, even if Vb is written in the floating body 102 in "1" writing, when the word line returns to 0 V upon the completion of writing, the floating body 102 is lowered to a negative bias. Since writing of "0" brings a deeper negative bias, as illustrated in FIG. 10C, it is not possible to make the potential difference margin between "1" and "0" sufficiently large at the time of writing. This small operation margin is a major problem for the DRAM memory cell. In addition, the density of the DRAM memory cell needs to be increased.

SUMMARY OF THE INVENTION

In a capacitor-less single-transistor DRAM (gain cell), which is a memory device using an SGT, the capacitive coupling between a word line and an SGT body in the floating state is large, and there has been a problem in that, when the potential of the word line is made to swing at the time of reading or writing of data, the swing is directly transmitted as noise to the SGT body. This results in a problem of reading error or rewriting error of storage data and makes it difficult to put a capacitor-less single-transistor DRAM (gain cell) into practical use. It is necessary not only to solve the above problem but also to achieve a higher performance and density of the DRAM memory cell.

To solve the above problem, an aspect of the present invention is a manufacturing method of a semiconductor memory device that performs a data retention operation and a data erase operation, the data retention operation being an operation in which voltages to be applied to a first gate conductor layer, a second gate conductor layer, a third gate conductor layer, a first impurity layer, and a second impurity layer are controlled to retain, inside a semiconductor pillar, a group of holes or electrons that are generated by an impact ionization phenomenon or a gate induced drain leakage current and that serve as majority carriers in the semiconductor pillar, and the data erase operation being an operation in which the voltages to be applied to the first gate conductor layer, the second gate conductor layer, the third gate conductor layer, the first impurity layer, and the second impurity layer are controlled to remove, from the semiconductor pillar, the group of holes or electrons that serve as majority carriers in the semiconductor pillar, the manufacturing method comprising:

a step of stacking, on a substrate, from a bottom in a vertical direction, the first impurity layer, a first insulating layer, a first material layer, a second insulating layer, a second material layer, a third insulating layer, a third material layer, and a fourth material layer;

a step of forming a first hole whose bottom portion is on an upper surface or in an inside of the first impurity layer and that penetrates the first insulating layer, the first material layer, the second insulating layer, the second material layer, the third insulating layer, the third material layer, and the fourth material layer;

a step of forming the semiconductor pillar to be embedded in the first hole;

a step of removing the first material layer to form a second hole, removing the second material layer to form a third hole, and removing the third material layer to form a fourth hole;

a step of oxidizing an outermost surface of the semiconductor pillar exposed in the second hole to form a first gate insulating layer, oxidizing an outermost surface of the semiconductor pillar exposed in the third hole to form a second gate insulating layer, and oxidizing an outermost surface of the semiconductor pillar exposed in the fourth hole to form a third gate insulating layer;

a step of forming the first gate conductor layer embedded in the second hole and covering the first gate insulating layer, forming the second gate conductor layer embedded in the third hole and covering the second gate insulating layer, and forming the third gate conductor layer embedded in the fourth hole and covering the third gate insulating layer; and a step of forming the second impurity layer connected to a top portion of the semiconductor pillar (first invention).

In the first invention, if one of the first impurity layer and the second impurity layer is connected to a source line, an other of the first impurity layer and the second impurity layer is connected to a bit line, and if one or two of the first gate conductor layer, the second gate conductor layer, and the third gate conductor layer are connected to a plate line, two others or an other of the first gate conductor layer, the second gate conductor layer, and the third gate conductor layer is connected to a word line, and a wiring conductor layer of the bit line is formed to extend in a direction orthogonal to a wiring conductor layer of the word line in plan view (second invention).

In the first invention, the manufacturing method further includes:
  a step of removing part of the fourth material layer to expose the top portion of the semiconductor pillar; and
  a step of forming a third impurity layer covering the exposed top portion of the semiconductor pillar, in which
    the third impurity layer serves as the second impurity layer (third invention).

In the third invention, the manufacturing method further includes
  a step of forming a fourth impurity layer on the top portion of the semiconductor pillar, in which
    the third impurity layer and the fourth impurity layer form the second impurity layer (fourth invention).

In the first invention, the manufacturing method further includes a step of forming, on inner walls of the first hole, the second hole, and the third hole, a fourth gate insulating layer covering the first gate insulating layer, the second gate insulating layer, and the third gate insulating layer after the first gate insulating layer, the second gate insulating layer, and the third gate insulating layer are formed (fifth invention).

In the first invention, the fourth material layer includes at least one insulating layer (sixth invention).

In the first invention, the manufacturing method further includes:
  a step of forming dummy semiconductor pillars in an outer side of a block region in which semiconductor pillars, each of which is the semiconductor pillar, are arranged two-dimensionally in plan view; and
  a step of removing part of the first insulating layer, the first material layer, the second insulating layer, the second material layer, the third insulating layer, the third material layer, and the fourth material layer, the part sticking out to the outer side of the block region in plan view (seventh invention).

In the first invention, the fourth material layer is formed of a fourth insulating layer and a fifth material layer from the bottom, and the manufacturing method further includes a step of etching part or all of a periphery of the fifth material layer to expose the top portion of the semiconductor pillar (eighth invention).

In the first invention, the manufacturing method further includes a step of leaving the first gate conductor layer, the first gate conductor layer being continuous with a first gate conductor layer of a semiconductor pillar that is substantially identical with the semiconductor pillar and is formed adjacent to the semiconductor pillar (ninth invention).

In the ninth invention, the manufacturing method further includes a step of leaving the second gate conductor layer, the second gate conductor layer being continuous with a second gate conductor layer of the adjacent semiconductor pillar (tenth invention).

In the first invention, at least one of the first gate conductor layer, the second gate conductor layer, and the third gate conductor layer is formed to be divided into a plurality of parts in the vertical direction (eleventh invention).

In the first invention, at least one of the first gate conductor layer, the second gate conductor layer, and the third gate conductor layer is formed to be divided into a plurality of parts on a horizontal cross section (twelfth invention).

In the first invention, vertical-direction lengths of the first gate conductor layer, the second gate conductor layer, and the third gate conductor layer are formed to be equal (thirteenth invention).

To solve the above problem, a semiconductor memory device according to another aspect of the present invention includes:
  a semiconductor base on a substrate, the semiconductor base standing vertically or extending horizontally to the substrate;
  a first impurity layer and a second impurity layer at both ends of the semiconductor base;
  a first gate insulating layer, a second gate insulating layer, and a third gate insulating layer surrounding part or all of a side surface of the semiconductor base between the first impurity layer and the second impurity layer sequentially from the first impurity layer toward the second impurity layer, the first gate insulating layer being in contact with or in proximity to the first impurity layer, the second gate insulating layer surrounding part or all of the side surface of the semiconductor base and being connected to the first gate insulating layer, and the third gate insulating layer surrounding part or all of the side surface of the semiconductor base, being connected to the second gate insulating layer, and being in contact with or in proximity to the second impurity layer;
  a first gate conductor layer covering the first gate insulating layer;
  a second gate conductor layer covering the second gate insulating layer;
  a third gate conductor layer covering the third gate insulating layer;
  a second insulating layer between the first gate conductor layer and the second gate conductor layer; and
  a third insulating layer between the second gate conductor layer and the third gate conductor layer, wherein
    the semiconductor memory device performs a memory write operation by performing an operation in which voltages to be applied to the first impurity layer, the second impurity layer, the first gate conductor layer, the second gate conductor layer, and the third gate conductor layer are controlled to cause an impact ionization phenomenon in the semiconductor base with a current flowing between the first impurity layer and the second impurity layer, an operation in which, out of a group of electrons or holes that are generated, the group of electrons is removed from the first impurity layer or the second impurity layer, and an operation in which part or all of the group of holes is left in the semiconductor base, and
    the semiconductor memory device performs a memory erase operation in which the voltages to be applied to the first impurity layer, the second impurity layer, the first gate conductor layer, the second gate conductor layer, and the third gate conductor layer are controlled to discharge a left group of holes of the group of holes from one or both of the first impurity layer and the second impurity layer (fourteenth invention).

In the fourteenth invention, in the memory erase operation, a first PN junction between the semiconductor base and the first impurity layer and a second PN junction between the semiconductor base and the second impurity layer are kept in a reverse bias state, and a voltage of the first gate conductor layer is lower than a voltage of the second gate conductor layer (fifteenth invention).

In the fourteenth invention, if one of the first impurity layer and the second impurity layer is connected to a source line, an other of the first impurity layer and the second impurity layer is connected to a bit line, and if one or two of the first gate conductor layer, the second gate conductor layer, and the third gate conductor layer are connected to a plate line, two others or an other of the first gate conductor layer, the second gate conductor layer, and the third gate conductor layer is connected to a word line (sixteenth invention).

In the sixteenth invention, a first gate capacitance is greater than a second gate capacitance, the first gate capacitance being a gate capacitance between the semiconductor base and one or more of the first gate conductor layer, the second gate conductor layer, and the third gate conductor layer connected to the plate line, and the second gate capacitance being a gate capacitance between the semiconductor base and one or more of the first gate conductor layer, the second gate conductor layer, and the third gate conductor layer connected to the word line (seventeenth invention).

In the fourteenth invention, at least one of the first gate conductor layer, the second gate conductor layer, and the third gate conductor layer is formed to be divided into a plurality of parts in a vertical direction (eighteenth invention).

In the fourteenth invention, at least one of the first gate conductor layer, the second gate conductor layer, and the third gate conductor layer is formed to be divided into a plurality of parts on a horizontal cross section (nineteenth invention).

In the fourteenth invention, vertical-direction lengths of the first gate conductor layer, the second gate conductor layer, and the third gate conductor layer are formed to be equal (twentieth invention).

BRIEF DESCRIPTION OF THE DRAWINGS

FIGS. 2A to 2C are diagrams for describing an erase operation mechanism of the semiconductor memory device according to the first embodiment.

FIGS. 3A to 3C are diagrams for describing a write operation mechanism of the semiconductor memory device according to the first embodiment.

FIGS. 4AA to 4AC are diagrams for describing a read operation mechanism of the semiconductor memory device according to the first embodiment.

FIGS. 5CA to 5CC are diagrams for describing the manufacturing method of the semiconductor memory device according to the first embodiment.

FIGS. 5HA to 5HC are diagrams for describing the manufacturing method of the semiconductor memory device according to the first embodiment.

FIGS. 5KA to 5KC are diagrams for describing the manufacturing method of the semiconductor memory device according to the first embodiment.

FIGS. 5LA to 5LC are diagrams for describing the manufacturing method of the semiconductor memory device according to the first embodiment.

FIGS. 5MA to 5MC are diagrams for describing the manufacturing method of the semiconductor memory device according to the first embodiment.

FIGS. 7AA to 7AC are diagrams for describing a manufacturing method of a semiconductor memory device according to a third embodiment.

FIGS. 7BA to 7BC are diagrams for describing the manufacturing method of the semiconductor memory device according to the third embodiment.

DESCRIPTION OF THE PREFERRED EMBODIMENTS

Hereinafter, a structure, operation mechanisms, and a manufacturing method of a semiconductor memory device (hereinafter referred to as dynamic flash memory) according to embodiments of the present invention will be described with reference to the drawings.

First Embodiment

A structure, operation mechanisms, and a manufacturing method of a dynamic flash memory cell according to a first embodiment of the present invention will be described with reference to FIGS. 1 to 5MC. The structure of the dynamic flash memory cell will be described with reference to FIG. 1. In addition, a data erase mechanism, a data write mechanism, and a data read mechanism will be described with reference to FIGS. 2A to 2C, FIGS. 3A to 3C, and FIGS. 4AA to 4BC, respectively. Furthermore, the manufacturing method of the dynamic flash memory will be described with reference to FIGS. 5AA to 5MC.

Figure 1:
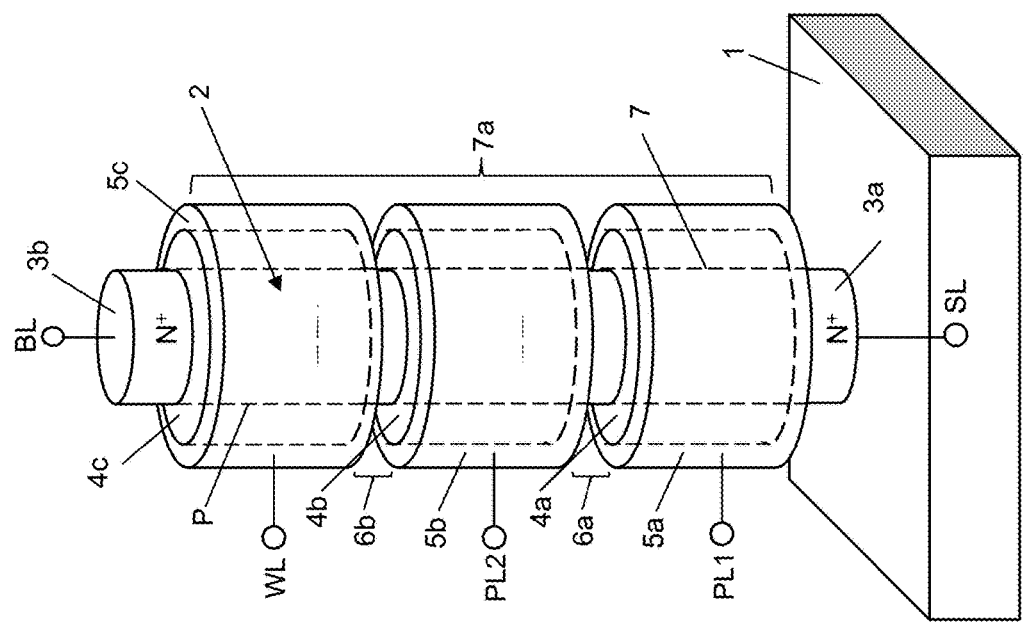
FIG. 1 is a structure diagram of a semiconductor memory device according to a first embodiment.

FIG. 1 illustrates a structure of the dynamic flash memory cell according to the first embodiment of the present invention. On a substrate 1 (which is an example of "substrate" in the claims), there is a silicon semiconductor pillar 2 (which is an example of "semiconductor pillar" in the claims) (hereinafter the silicon semiconductor pillar will be referred to as "Si pillar"). In the Si pillar 2, from the bottom, there are an N$^+$ layer 3a (which is an example of "first impurity layer" in the claims), a P layer 7 (hereinafter, a semiconductor region containing an acceptor impurity is referred to as "P layer"), and an N$^+$ layer 3b (which is an example of "second impurity layer" in the claims). The P layer 7 between the N$^+$ layers 3a and 3b serves a channel region 7a. To surround a lower portion of the Si pillar 2, from the bottom, there are a first gate insulating layer 4a (which is an example of "first gate insulating layer" in the claims), a second gate insulating layer 4b (which is an example of "second gate insulating layer" in the claims), and a third gate insulating layer 4c (which is an example of "third gate insulating layer" in the claims). In addition, there are a first gate conductor layer 5a (which is an example of "first gate conductor layer" in the claims) to surround the first gate insulating layer 4a, a second gate conductor layer 5b (which is an example of "second gate conductor layer" in the claims) to surround the second gate insulating layer 4b, and a third gate conductor layer 5c (which is an example of "third gate conductor layer" in the claims) to surround the third gate insulating layer 4c. Furthermore, the first gate conductor layer 5a and the second gate conductor layer 5b are isolated from each other by an insulating layer 6a, and the second gate conductor layer 5b and the third gate conductor layer 5c are isolated from each other by an insulating layer 6b. Thus, the dynamic flash memory cell is constituted by the N$^+$ layers 3a and 3b, the P layer 7, the first gate insulating layer 4a, the second gate insulating layer 4b, the third gate insulating layer 4c, the first gate conductor layer 5a, the second gate conductor layer 5b, and the third gate conductor layer 5c.

As illustrated in FIG. 1, the N$^+$ layer 3a, the N$^+$ layer 3b, the first gate conductor layer 5a, the second gate conductor layer 5b, and the third gate conductor layer 5c are respectively connected to a source line SL (which is an example of "source line" in the claims), a bit line BL (which is an example of "bit line" in the claims), a first plate line PL1, a second plate line PL2 (the first plate line PL1 and the second plate line PL2 are examples of "plate line" in the claims), and a word line WL (which is an example of "word line" in the claims).

Note that gate capacitances of the first gate conductor layer 5a connected to the first plate line PL1 and the second gate conductor layer 5b connected to the second plate line PL2 are desirably configured to be greater than a gate capacitance of the third gate conductor layer 5c connected to the word line WL.

Any or all of the first gate conductor layer 5a, the second gate conductor layer 5b, and the third gate conductor layer 5c may be divided into two or more in plan view, and may be operated synchronously or asynchronously each as conductive electrodes of the plate line or the word line. Any or all of the first gate conductor layer 5a, the second gate conductor layer 5b, and the third gate conductor layer 5c may be divided into two or more in a vertical direction, and divided plate lines and word lines may be operated synchronously or asynchronously. In these manners, dynamic flash memory operations may also be performed.

Alternatively, the N$^+$ layer 3a may be connected to the bit line BL, and the N$^+$ layer 3b may be connected to the source line SL. Alternatively, any two of the first gate conductor layer 5a, the second gate conductor layer 5b, and the third gate conductor layer 5c may be connected to the first plate line PL1 and the second plate line PL2. Alternatively, any one or two of the first gate conductor layer 5a, the second gate conductor layer 5b, and the third gate conductor layer 5c may be connected to different word lines WL.

In addition to the first gate conductor layer 5a and the second gate conductor layer 5b, a gate conductor layer connected to at least one of the first plate line PL1 and the second plate lines PL2 may be provided. The gate conductor layers may be operated synchronously or asynchronously each as conductive electrodes of the plate line. In these manners, dynamic flash memory operations may also be performed.

Figure 2C:
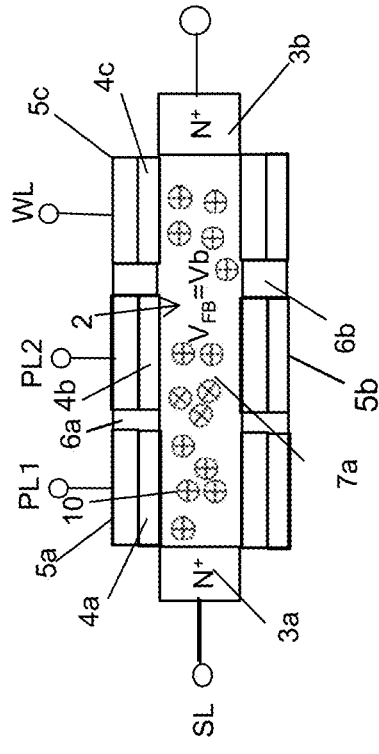
Figure 2C:
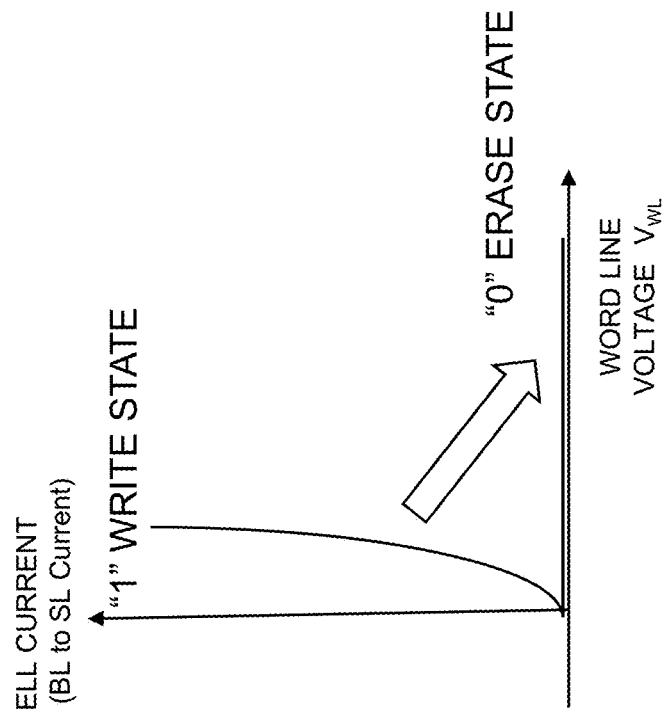
Figure 2C:
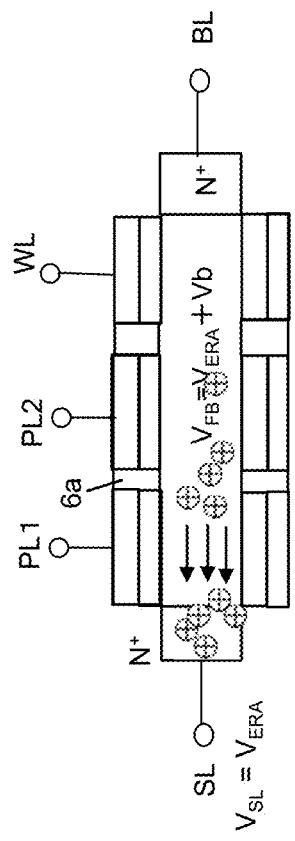

An erase operation mechanism will be described with reference to FIGS. 2A to 2C. The channel region 7a between the N$^+$ layers 3a and 3b is electrically isolated from the substrate 1 and serves as a floating body. FIG. 2A illustrates a state in which a group of holes 10 generated by impact ionization in a previous cycle are stored in the channel region 7a before an erase operation. Then, as illustrated in FIG. 2B, at the time of the erase operation, the voltage of the source line SL is set to a negative voltage $V_{ERA}$. Here, $V_{ERA}$ is −3 V, for example. Accordingly, regardless of the value of the initial potential of the channel region 7a, the PN junction between the channel region 7a and the N$^+$ layer 3a serving as a source and connected to the source line SL becomes forward biased. As a result, the group of holes 10 stored in the channel region 7a, generated by impact ionization in the previous cycle, are sucked into the N$^+$ layer 3a of the source portion, and a potential $V_{FB}$ of the channel region 7a becomes substantially $V_{FB}=V_{ERA}+Vb$. Here, Vb is the built-in voltage of the PN junction and is about 0.7 V. Therefore, if $V_{ERA}=-3$ V, the potential of the channel region 7a is −2.3 V. This value corresponds to the potential state of the channel region 7a in the erase state. Therefore, if the potential of the channel region 7a of the floating body becomes negative, the threshold voltage of the N-channel MOS transistor of the dynamic flash memory cell is increased due to a substrate biasing effect. This results in a higher threshold voltage for the third gate conductor layer 5c connected to this word line WL, as illustrated in FIG. 2C. The erase state of this channel region 7a is logic storage data "0". Note that the above-described conditions of voltages applied to the bit line BL, the source line SL, the word line WL, the first plate line PL1, and the second plate line PL2 and the potential of the floating body are examples for performing the erase operation, and any other operation conditions may be employed by which the erase operation can be performed.

Figure 3C:
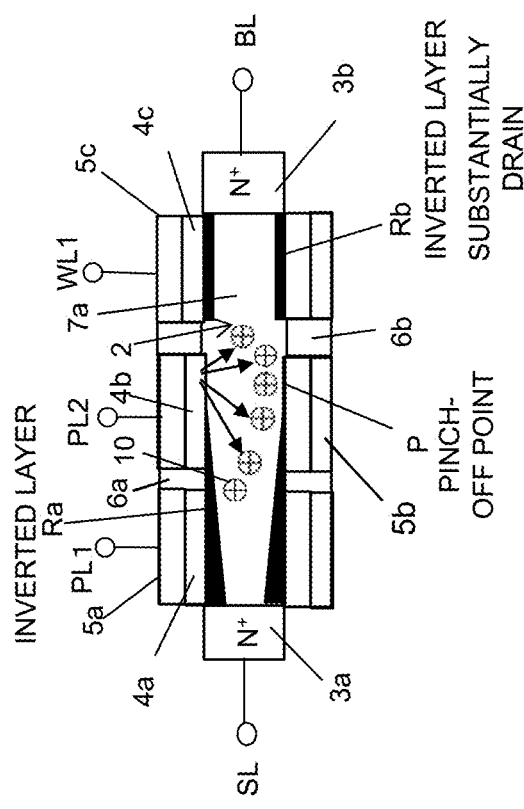
Figure 3C:
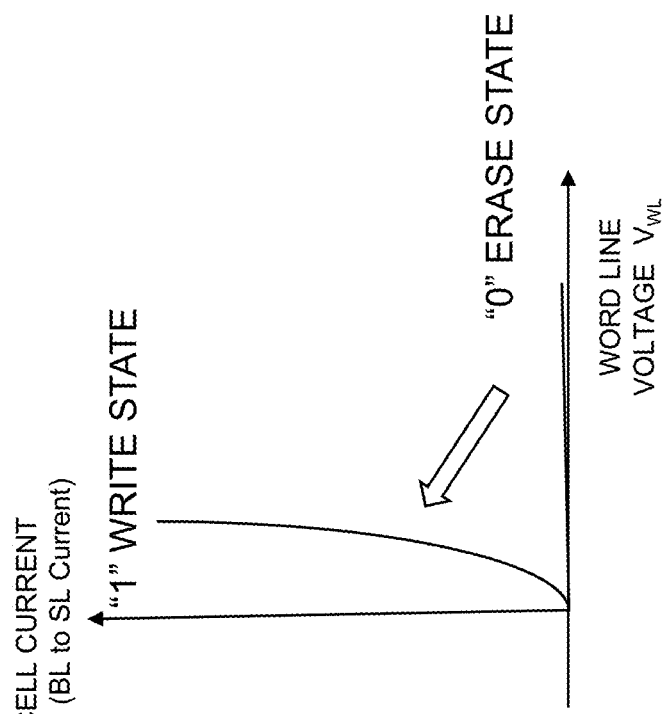
Figure 3C:
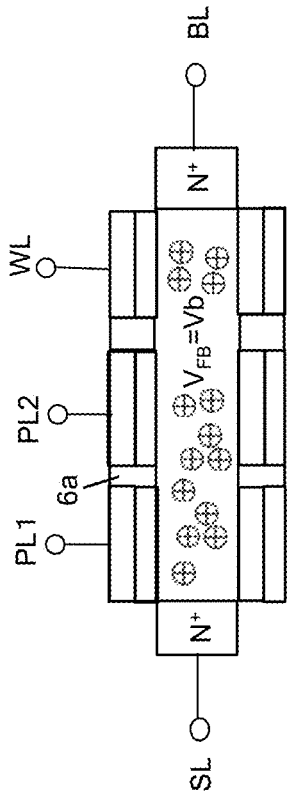

FIGS. 3A to 3C illustrate a write operation of the dynamic flash memory cell. In FIG. 3A, for example, 0 V is input to the N$^+$ layer 3a connected to the source line SL, 3 V is input to the N$^+$ layer 3b connected to the bit line BL, 2 V is input to the first gate conductor layer 5a connected to the first plate line PL1, 2 V is input to the second gate conductor layer 5b connected to the second plate line PL2, and, 5 V is input to the third gate conductor layer 5c connected to the word line WL. As a result, as illustrated in FIG. 3A, a ring-shaped inverted layer Ra is formed in the channel region 7a inside the first gate conductor layer 5a connected to the first plate line PL1 and the second gate conductor layer 5b connected to the second plate line PL2, and a dual-gate structure first N-channel MOS transistor region including the first gate conductor layer 5a and the second gate conductor layer 5b is operated in the saturation region. Accordingly, there is a pinch-off point P in the inverted layer Ra. On the other hand, a second N-channel MOS transistor region including the third gate conductor layer 5c connected to the word line WL is operated in the linear region. Accordingly, the channel region 7a inside the third gate conductor layer 5c connected to the word line WL does not include a pinch-off point, and an inverted layer Rb is entirely formed. In this case, the inverted layer Rb formed entirely inside the third gate conductor layer 5c connected to the word line WL substantially serves as a drain of the first N-channel MOS transistor region including the first gate conductor layer 5a and the second gate conductor layer 5b.

As a result, the electric field becomes maximum in a first boundary region of the channel region 7a between the first N-channel MOS transistor region and the second N-channel MOS transistor region that are connected in series, and an impact ionization phenomenon occurs in this region. This region is a region on the source side when viewed from the second N-channel MOS transistor region including the third gate conductor layer 5c connected to the word line WL, and thus, this phenomenon is referred to as a source-side impact ionization phenomenon. As a result of this source-side impact ionization phenomenon, electrons flow from the N$^+$ layer 3a connected to the source line SL toward the N$^+$ layer 3b connected to the bit line BL. The accelerated electrons collide with lattice Si atoms, and electron-hole pairs are generated by the kinetic energy. Although some of the generated electrons flow into the first gate conductor layer 5a, the second gate conductor layer 5b, and the third gate conductor layer 5c, most of the generated electrons flow into the N$^+$ layer 3b connected to the bit line BL. At the time of writing "1", electron-hole pairs may be generated by a gate induced drain leakage (GIDL) current, and the floating body (denoted by "FB" in FIG. 4BA) may be charged with the generated group of holes (see, for example, E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006). Alternatively, the N-channel MOS transistor region of the first gate conductor layer 5a connected to the first plate line PL1 may be operated in the linear region, the N-channel MOS transistor region of the second gate conductor layer 5b may be operated in the saturation region, and the N-channel MOS transistor region of the third gate conductor layer 5c may be operated in the linear region. In this case, the N-channel MOS transistor region of the first gate conductor layer 5a appears to be the source. Thus, the electric field intensity at the boundary between the first N-channel MOS transistor region and the second N-channel MOS transistor region can be further increased, and the impact ionization phenomenon can be made to occur at a low voltage.

As illustrated in FIG. 3B, the generated group of holes 10 serve as majority carriers in the channel region 7a and charge the channel region 7a to a positive bias. Since the N$^+$ layer 3a connected to the source line SL is at 0 V, the channel region 7a is charged up to near the built-in voltage Vb (about 0.7 V) of the PN junction between the channel region 7a and the N$^+$ layer 3a connected to the source line SL. If the channel region 7a is charged to a positive bias, the threshold voltages of the first N-channel MOS transistor region and the second N-channel MOS transistor region decrease due to the substrate bias effect. Accordingly, as illustrated in FIG. 3C, the threshold voltage of the second N-channel MOS transistor region connected to the word line WL decreases. This write state of the channel region 7a is assigned to logical storage data "1".

At the time of the write operation, instead of the first boundary region, in a boundary region between the N$^+$ layer 3a and the channel region 7a or a boundary region between the N$^+$ layer 3b and the channel region 7a, electron-hole pairs may be generated by the impact ionization phenomenon or the GIDL current, and the generated group of holes 10 may charge the channel region 7a. Note that the above-described conditions of voltages applied to the bit line BL, the source line SL, the word line WL, the first plate line PL1, and the second plate line PL2 are examples for performing the write operation, and any other voltage conditions may be employed by which the write operation can be performed.

A read operation of the dynamic flash memory cell will be described with reference to FIGS. 4AA to 4BC. A read operation of the dynamic flash memory cell will be described with reference to FIGS. 4AA to 4AC. As illustrated in FIG. 4AA, if the channel region 7a is charged up to the built-in voltage Vb (about 0.7 V), the threshold voltage decreases due to the substrate bias effect. This state is assigned to logical storage data "1". As illustrated in FIG. 4AB, if a memory block selected before writing is in an erase state "0" in advance, the floating voltage $V_{FB}$ of the channel region 7a is $V_{ERA}$+Vb. A write state "1" is stored at random by the write operation. As a result, logical storage data of logical "0" and "1" is created for the word line WL. As illustrated in FIG. 4AC, the level difference between the two threshold voltages for the word line WL is utilized to perform reading by a sense amplifier.

Figure 4B:
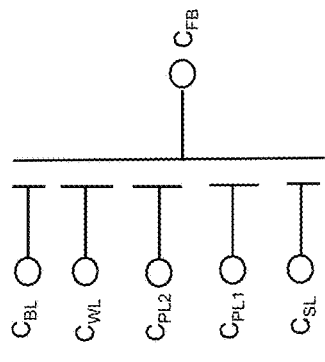
FIGS. 4BA to 4BC are diagrams for describing the read operation mechanism of the semiconductor memory device according to the first embodiment.
Figure 4B:
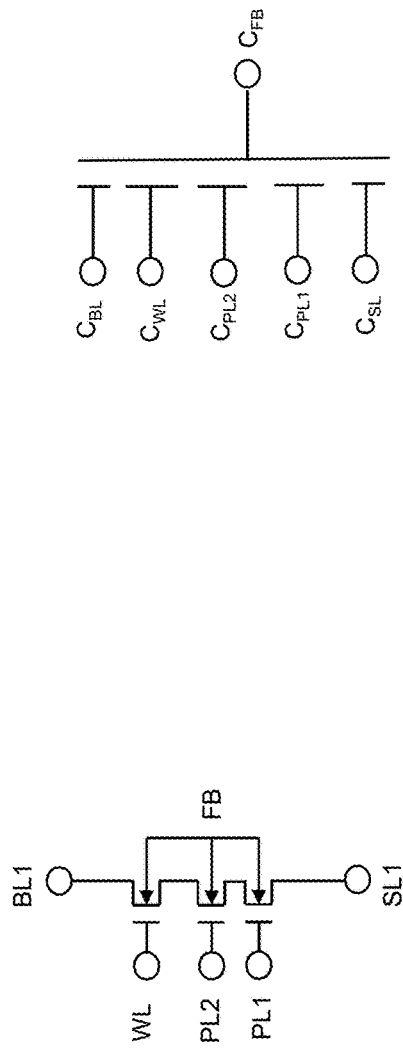
Figure 4B:
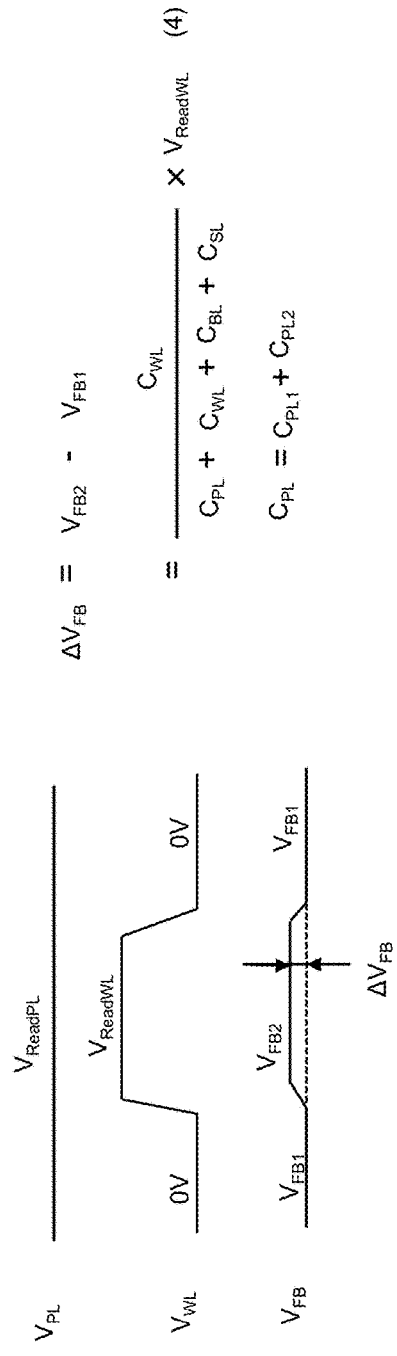

With reference to FIGS. 4BA to 4BC, a relationship among the gate capacitances of the first gate conductor layer 5a, the second gate conductor layer 5b, and the third gate conductor layer 5c at the time of the read operation of the dynamic flash memory cell and an operation related thereto will be described. The gate capacitance of the third gate conductor layer 5c is desirably designed to be smaller than the gate capacitances of the first gate conductor layer 5a and the second gate conductor layer 5b. As illustrated in FIG. 4BA, vertical-direction lengths of the first gate conductor layer 5a and the second gate conductor layer 5b are set to be longer than a vertical-direction length of the third gate conductor layer 5c connected to the word line WL so as to make the gate capacitance of the third gate conductor layer 5c connected to the word line WL smaller than the gate capacitances of the first gate conductor layer 5a and the second gate conductor layer 5b, connected to the first plate line PL1 and the second plate line PL2, respectively. FIG. 4BB illustrates an equivalent circuit of the single dynamic flash memory cell.

FIG. 4BC illustrates a relationship among coupling capacitances in the dynamic flash memory. Here, $C_{WL}$ denotes a capacitance of the second gate conductor layer 5b, $C_{PL1}$ denotes a capacitance of the first gate conductor layer 5a, $C_{PL2}$ denotes a capacitance of the second gate conductor layer 5b, $C_{BL}$ denotes a capacitance of the PN junction between the channel region 7a and the N$^+$ layer 3b serving as the drain, and $C_{SL}$ denotes a capacitance of the PN junction between the channel region 7a and the N$^+$ layer 3a serving as the source. As illustrated in FIG. 4BC, if the voltage of the word line WL swings, the change affects the channel region 7a as noise. A potential change $\Delta V_{FB}$ of the channel region 7a at this time is denoted by $$\Delta V_{FB} = C_{WL}/(C_{PL}+C_{WL}+C_{BL}+C_{SL}) \times V_{ReadWL} \quad (4)$$

$$C_{PL} = C_{PL1} + C_{PL2}.$$

Here, $V_{ReadWL}$ denotes the potential at the word line WL changed at the time of reading. As is apparent from Equation (4), if the contribution ratio of $C_{WL}$ is made smaller than that of the total capacitance $C_{PL}+C_{WL}+C_{BL}+C_{SL}$ of the channel region 7a, $\Delta V_{FB}$ decreases. If the vertical-direction lengths of the first and second gate conductor layers 5a and 5b connected to the plate lines PL1 and PL2, respectively, are made longer than an vertical-direction length of the third gate conductor layer 5c connected to the word line WL, $\Delta V_{FB}$ can further decrease without reducing the degree of integration of the memory cell in plan view. Note that the above-described conditions of voltages applied to the bit line BL, the source line SL, the word line WL, the first plate line PL1, and the second plate line PL2 and the potential of the floating body are examples for performing the read operation, and any other operation conditions may be employed by which the read operation can be performed.

Figure 5A:
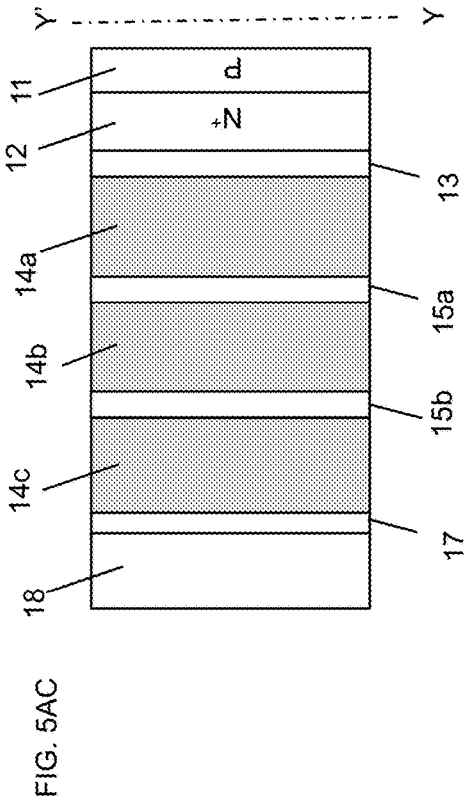
FIGS. 5AA to 5AC are structure diagrams for describing a manufacturing method of the semiconductor memory device according to the first embodiment.
Figure 5A:
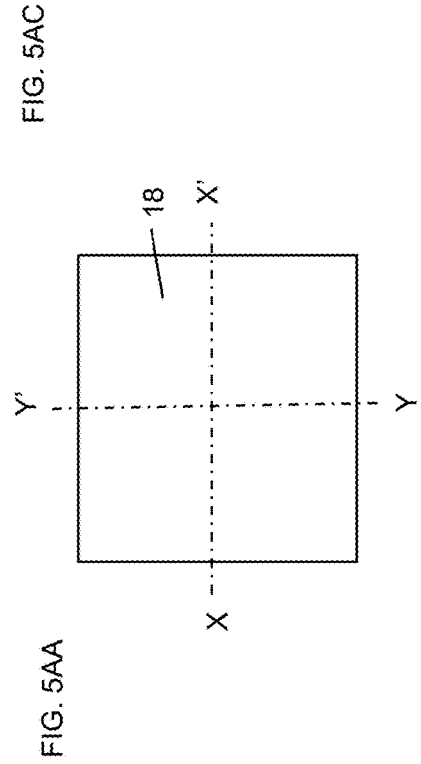
Figure 5A:
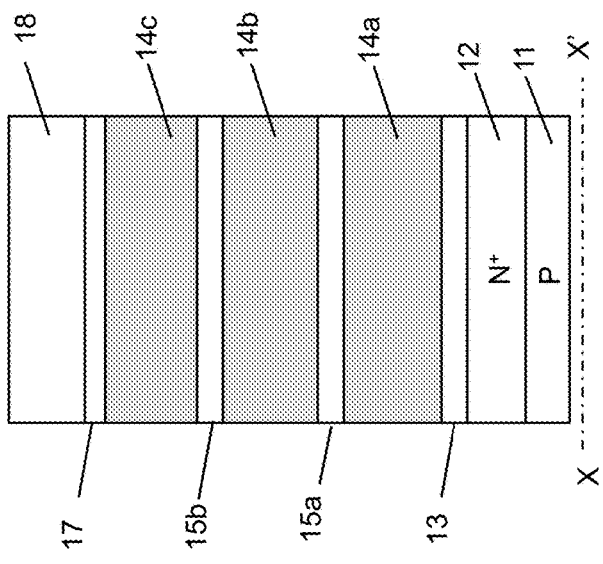

The manufacturing method of the semiconductor memory device according to the first embodiment will be described with reference to FIGS. 5AA to 5MC. FIGS. 5AA, 5BA, 5CA, 5DA, 5EA, 5FA, 5GA, 5HA, 5IA, 5JA, 5KA, 5LA, and 5MA are plan views of a single memory cell of the semiconductor memory device. FIGS. 5AB, 5BB, 5CB, 5DB, 5EB, 5FB, 5GB, 5HB, 5IB, 5JB, 5KB, 5LB, and 5MB are sectional views taken along line X-X' in FIGS. 5AA, 5BA, 5CA, 5DA, 5EA, 5FA, 5GA, 5HA, 5IA, 5JA, 5KA, 5LA, and 5MA, respectively. FIGS. 5AC, 5BC, 5CC, 5DC, 5EC, 5FC, 5GC, 5HC, 5IC, 5JC, 5KC, 5LC, and 5MC are sectional views taken along line Y-Y' in FIGS. 5AA, 5BA, 5CA, 5DA, 5EA, 5FA, 5GA, 5HA, 5IA, 5JA, 5KA, 5LA, and 5MA, respectively. A large number of such memory cells are arranged two-dimensionally in an actual memory device.

As illustrated in 5AA to 5AC, on a P-layer substrate 11 (which is an example of "substrate" in the claims), the following layers are formed from the bottom: an N$^+$ layer 12 (which is an example of "first impurity layer" in the claims), a first insulating layer 13 (which is an example of "first insulating layer" in the claims), a silicon nitride (SiN) layer 14a (which is an example of "first material layer" in the claims), a second insulating layer 15a (which is an example of "second insulating layer" in the claims), a SiN layer 14b (which is an example of "second material layer" in the claims), a third insulating layer 15b (which is an example of "third insulating layer" in the claims), a SiN layer 14c (which is an example of "third material layer" in the claims), a fourth insulating layer 17, a material layer 18 (the fourth insulating layer 17 and the material layer 18 are an example of "fourth material layer" in the claims). Note that the SiN layers 14a, 14b, and 14c desirably have the same length in the vertical direction.

Figure 5B:
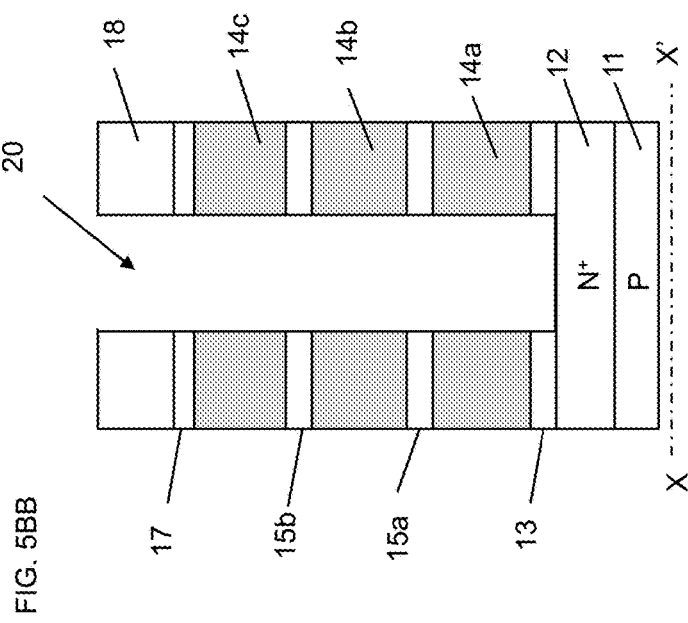
FIGS. 5BA to 5BC are diagrams for describing the manufacturing method of the semiconductor memory device according to the first embodiment.
Figure 5B:
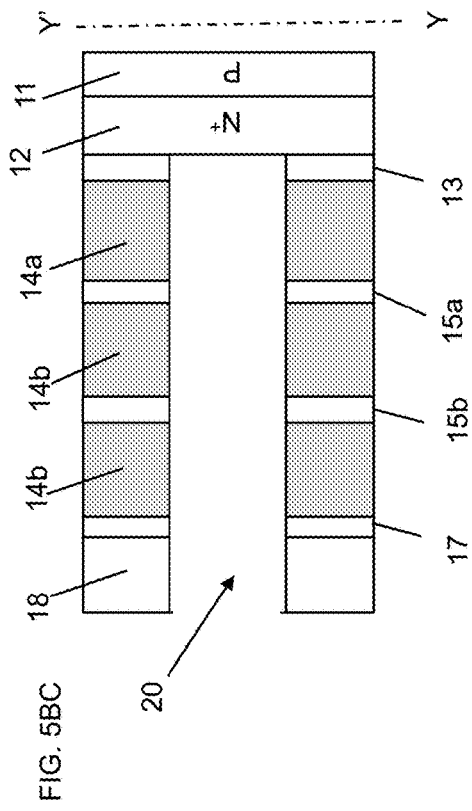
Figure 5B:
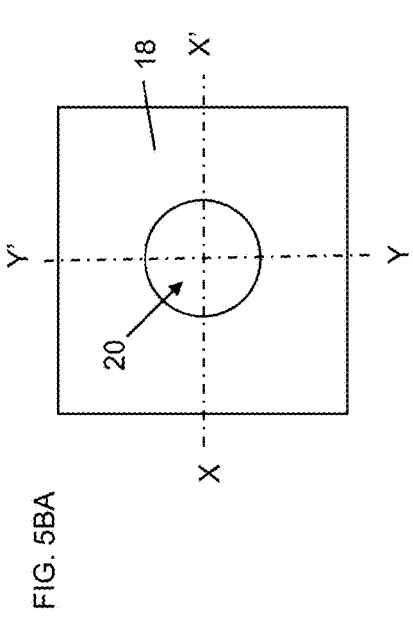

Subsequently, as illustrated in FIGS. 5BA to 5BC, the first insulating layer 13, the SiN layer 14a, the second insulating layer 15a, the SiN layer 14b, the third insulating layer 15b, the SiN layer 14c, the fourth insulating layer 17, and the material layer 18 are etched by photolithography and reactive ion etching (RIE) to form a hole 20 (which is an example of "first hole" in the claims) whose bottom portion is on the upper surface of the N$^+$ layer 12 or inside thereof.

Subsequently, as illustrated in FIGS. 5CA to 5CC, a Si pillar 22 (which is an example of "semiconductor pillar" in the claims) is formed in the hole 20 by epitaxial crystal growth. In this case, the Si pillar 22 is formed in the following manner: Si is grown by epitaxial crystal growth such that the upper surface position of Si protrudes from the upper surface position of the material layer 18, and then the upper surface position of Si is polished by chemical mechanical polishing (CMP) such that Si is flush with the material layer 18.

Figure 5D:
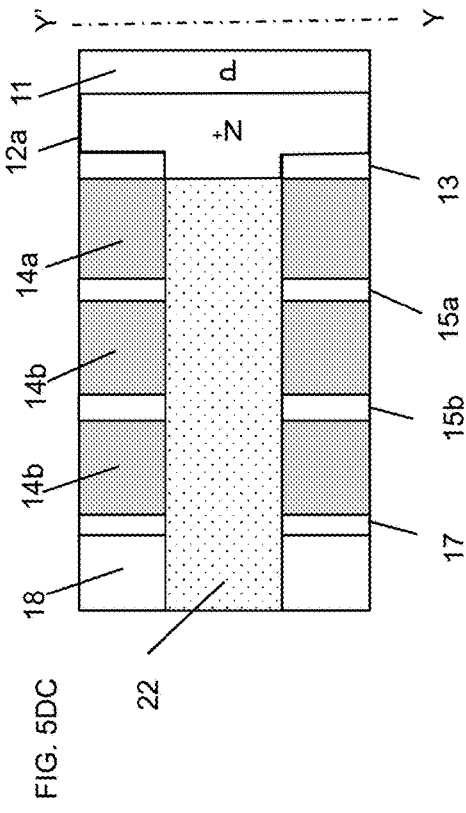
FIGS. 5DA to 5DC are diagrams for describing the manufacturing method of the semiconductor memory device according to the first embodiment.
Figure 5D:
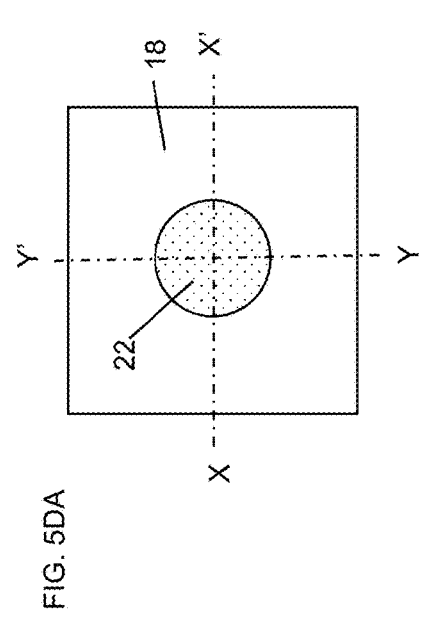
Figure 5D:
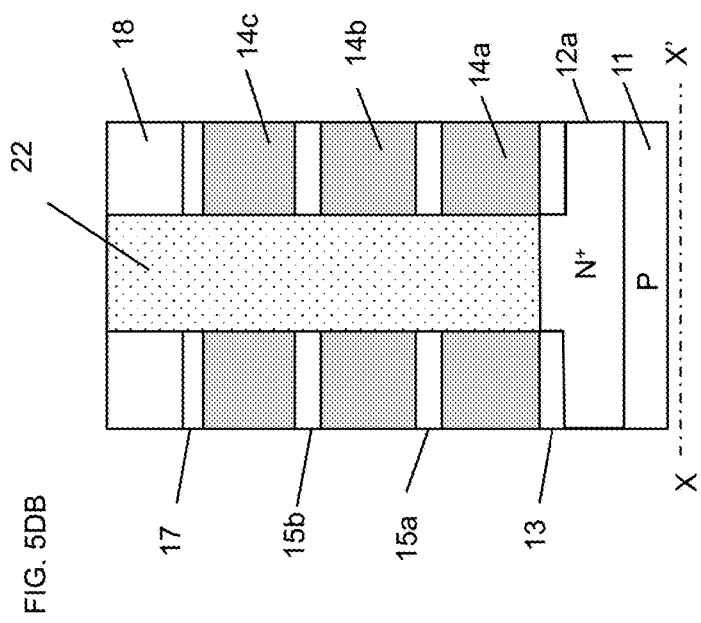

Subsequently, as illustrated in FIGS. 5DA to 5DC, a donor impurity in the N$^+$ layer 12 is made to diffuse into the Si pillar 22 by heat treatment to form an N$^+$ layer 12a.

Figure 5E:
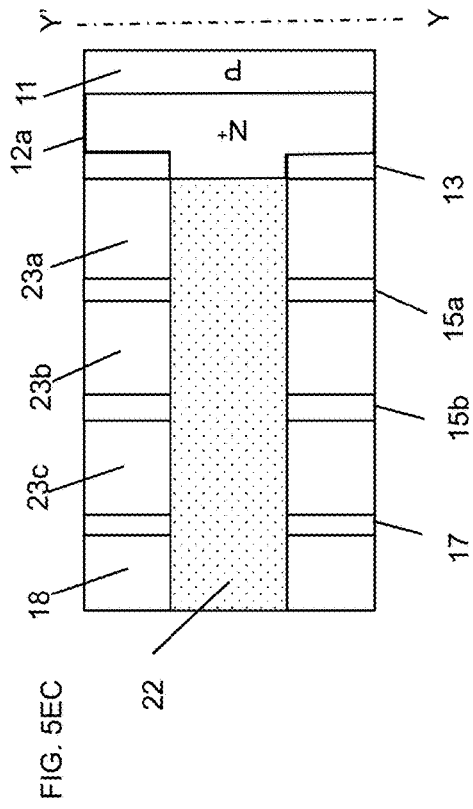
FIGS. 5EA to 5EC are diagrams for describing the manufacturing method of the semiconductor memory device according to the first embodiment.
Figure 5E:
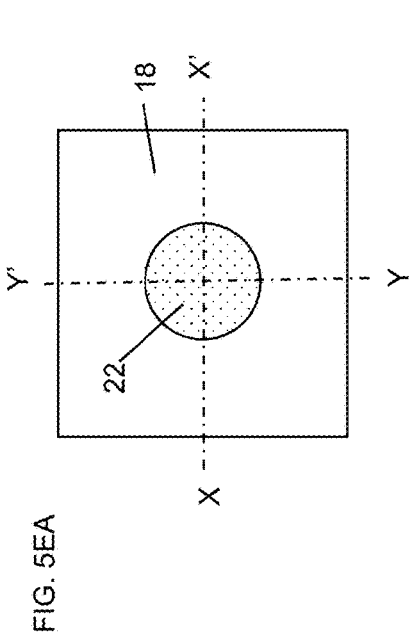
Figure 5E:
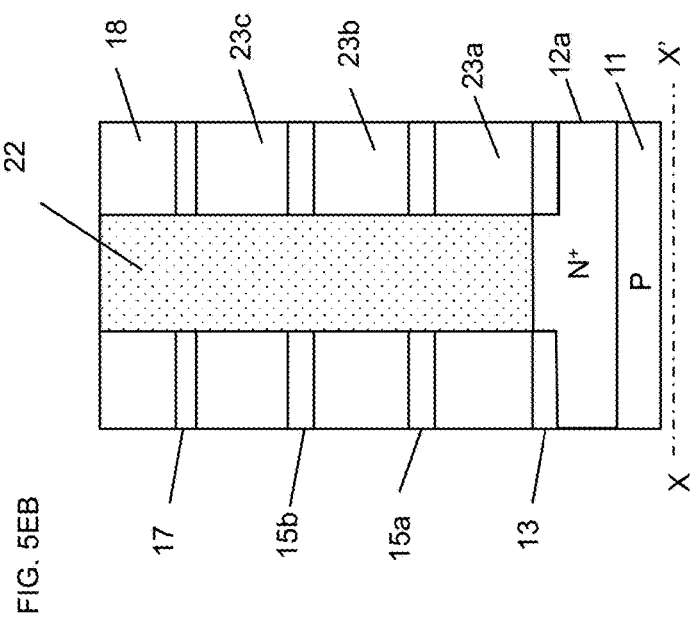

Subsequently, as illustrated in FIGS. 5EA to 5EC, the SiN layers 14a, 14b, and 14c are removed to form a hole 23a (which is an example of "second hole" in the claims), a hole 23b (which is an example of "third hole" in the claims), and a hole 23c (which is an example of "fourth hole" in the claims). Note that a large number of Si pillars are arranged two-dimensionally in an actual memory device, and thus, these Si pillars are support bodies connected to the first insulating layer 13, the second insulating layer 15a, the third insulating layer 15b, the fourth insulating layer 17, and the material layer 18. Thus, at the time of forming the holes 23a, 23b, and 23c, the second insulating layer 15a, the third insulating layer 15b, the fourth insulating layer 17, and the material layer 18 are prevented from being bent or broken. In addition, by forming dummy Si pillars in an outer side of a block region in which the Si pillars are arranged two-dimensionally so as to prevent the second insulating layer 15a, the third insulating layer 15b, the fourth insulating layer 17, and the material layer 18 from partly sticking out to an outer side of the dummy Si pillars in plan view, it is possible to prevent the second insulating layer 15a, the third insulating layer 15b, the fourth insulating layer 17, and the material layer 18 from being damaged in a cleaning step or at the time of etching the SiN layers 14a, 14b, and 14c.

Figure 5F:
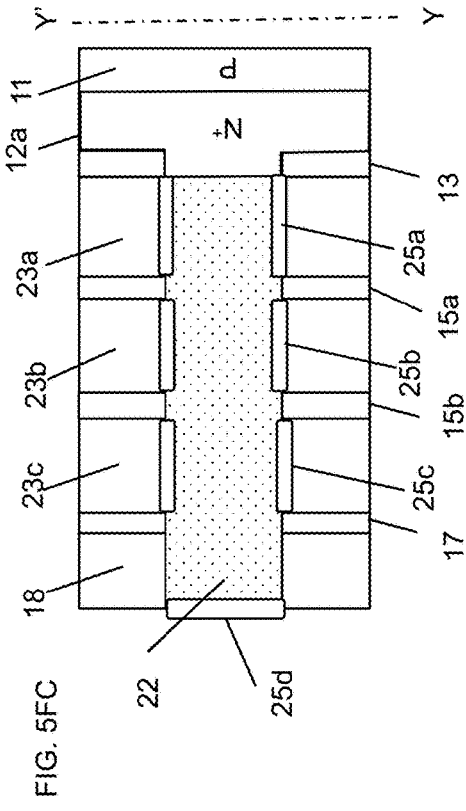
FIGS. 5FA to 5FC are diagrams for describing the manufacturing method of the semiconductor memory device according to the first embodiment.
Figure 5F:
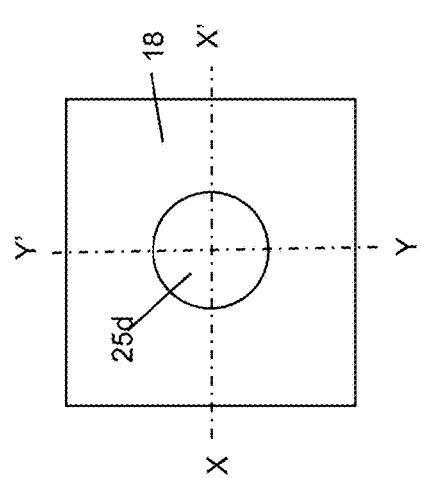
Figure 5F:
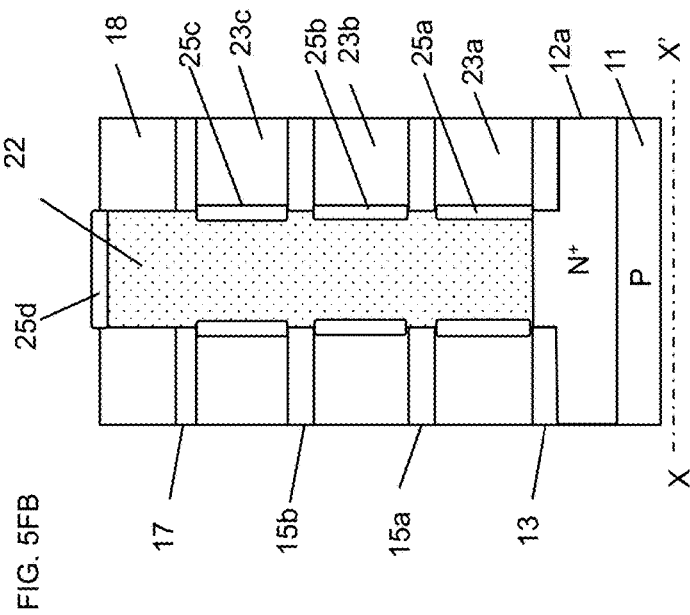

Subsequently, as illustrated in FIGS. 5FA to 5FC, the exposed Si pillar 22 is oxidized to form a SiO$_2$ layer 25a (which is an example of "first gate insulating layer" in the claims), a SiO$_2$ layer 25b (which is an example of "second gate insulating layer" in the claims), a SiO$_2$ layer 25c (which is an example of "third gate insulating layer" in the claims), and a SiO$_2$ layer 25d.

Figure 5G:
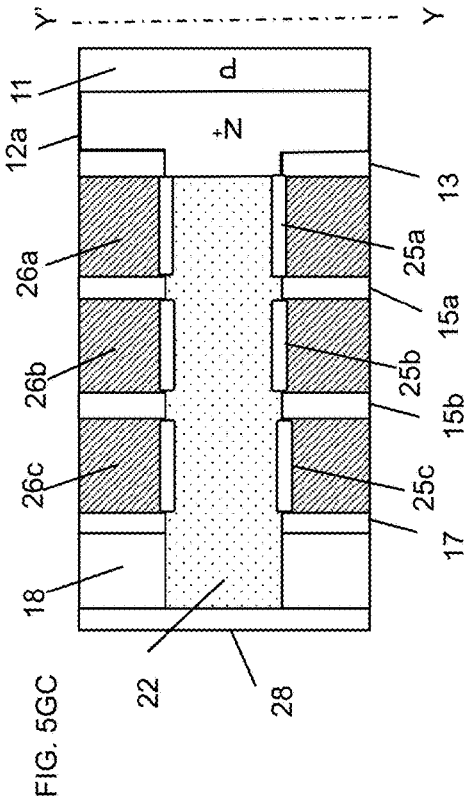
FIGS. 5GA to 5GC are diagrams for describing the manufacturing method of the semiconductor memory device according to the first embodiment.
Figure 5G:
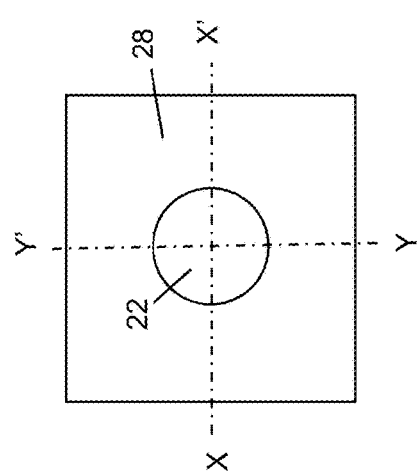
Figure 5G:
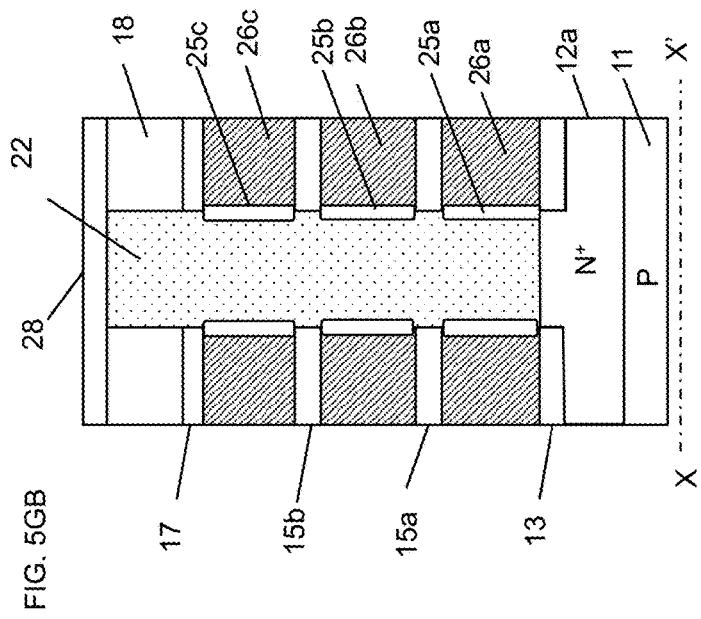

Subsequently, as illustrated in FIGS. 5GA to 5GC, the SiO$_2$ layer 25d is removed by CMP. Then, a fifth insulating layer 28 is formed on the upper surface. In the holes 23a, 23b, and 23c, doped poly-Si layers 26a, 26b, and 26c containing a large amount of donor or acceptor impurity are formed. In the formation of the doped poly-Si layers 26a, 26b, and 26c, a doped poly-Si layer is formed also on the fifth insulating layer 28. This doped poly-Si layer is removed by CMP. Note that the doped poly-Si layers 26a, 26b, and 26c are uniformly formed by making the lengths of the SiN layers 14a, 14b, and 14c in the vertical direction equal in FIGS. 5AA to 5AC.

Subsequently, as illustrated in FIGS. 5HA to 5HC, a material layer 18a and a fifth insulating layer 28a that surround the Si pillar 22 and extend in the line X-X' direction in plan view are formed by photolithography and RIE.

Figure 5I:
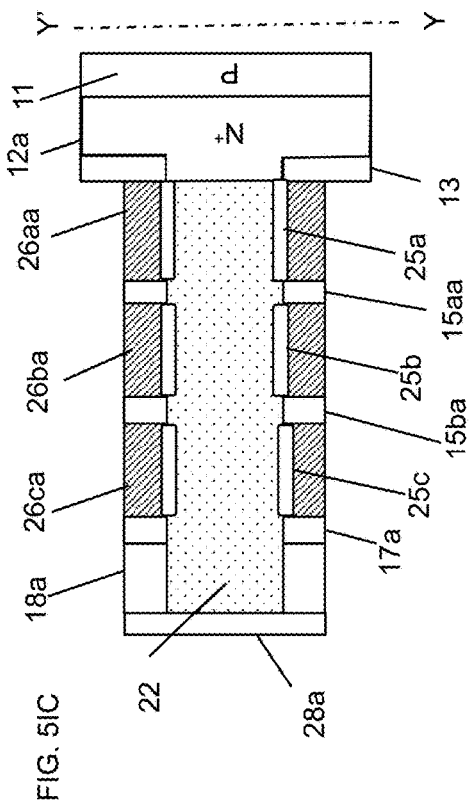
FIGS. 5IA to 5IC are diagrams for describing the manufacturing method of the semiconductor memory device according to the first embodiment.
Figure 5I:
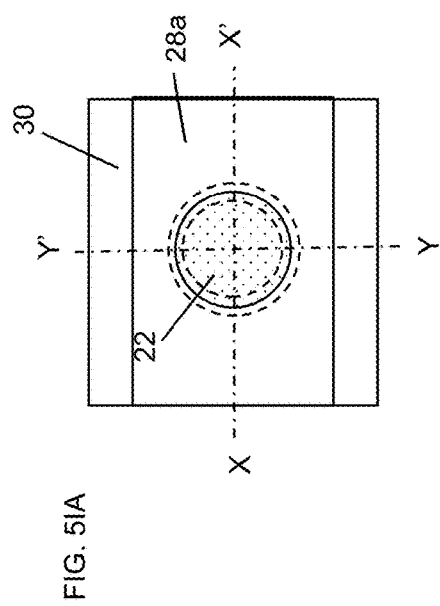
Figure 5I:
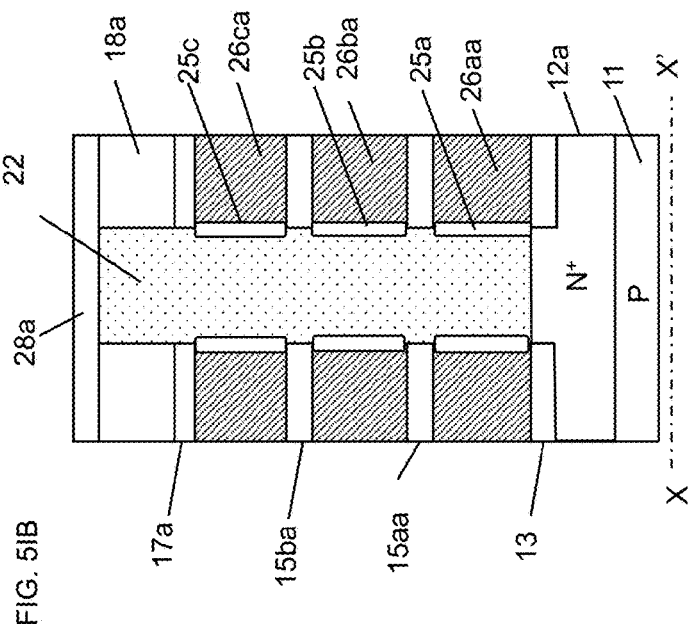

Subsequently, as illustrated in FIGS. 5IA to 5IC, by using the material layer 18a and the fifth insulating layer 28a as etching masks, the fourth insulating layer 17, the doped poly-Si layer 26c, the third insulating layer 15b, the doped poly-Si layer 26b, the second insulating layer 15a, and the doped poly-Si layer 26a are etched to form a fourth insulating layer 17a, a doped poly-Si layer 26aa (which is an example of "first gate conductor layer" in the claims), a second insulating layer 15aa, a doped poly-Si layer 26ba (which is an example of "second gate conductor layer" in the claims), a third insulating layer 15ba, and a doped poly-Si layer 26ca (which is an example of "third gate conductor layer" in the claims).

Figure 5J:
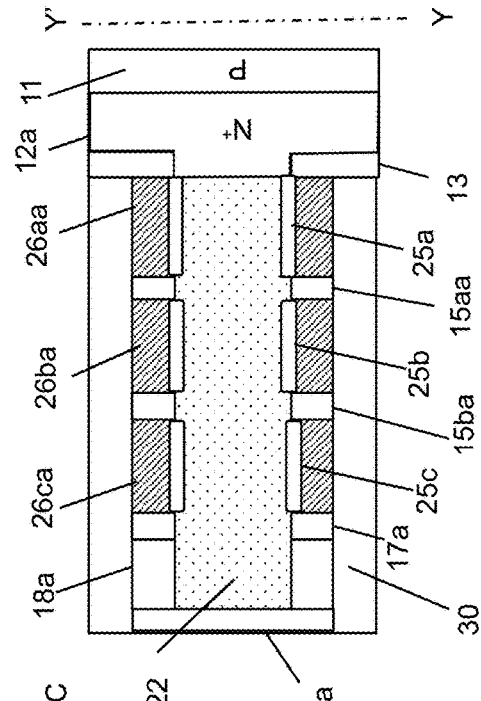
FIGS. 5JA to 5JC are diagrams for describing the manufacturing method of the semiconductor memory device according to the first embodiment.
Figure 5J:
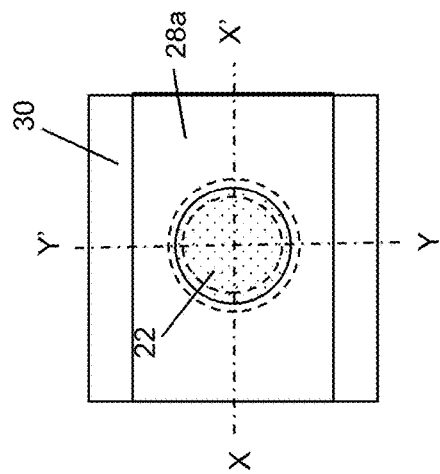
Figure 5J:
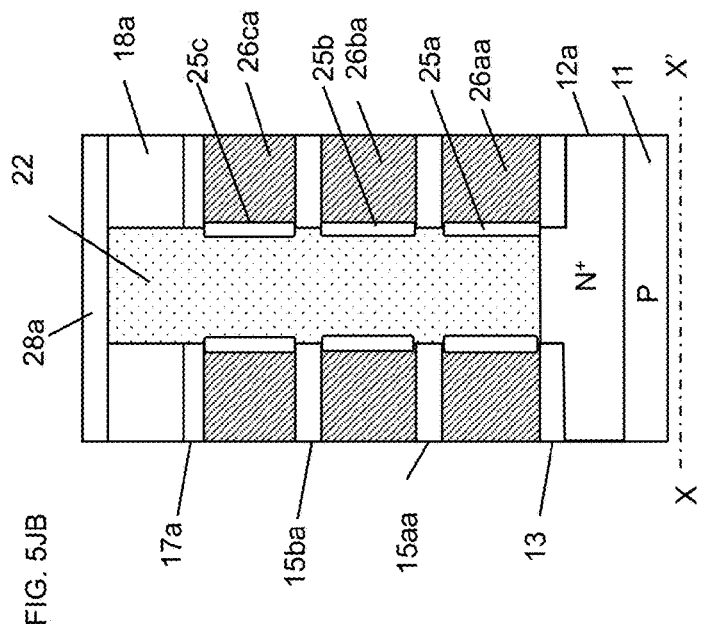

Subsequently, as illustrated in FIGS. 5JA to 5JC, a $SiO_2$ layer (not illustrated) is deposited entirely by chemical vapor deposition (CVD). Then, a $SiO_2$ layer 30 flush with the fifth insulating layer 28a is formed by CMP.

Subsequently, as illustrated in FIGS. 5KA to 5KC, a portion of the material layer 18a and the fifth insulating layer 28a above the fourth insulating layer 17a is removed. Then, an upper portion of the $SiO_2$ layer 30 is removed to form a $SiO_2$ layer 30a. Thus, a top portion of the Si pillar 22 is exposed.

Subsequently, as illustrated in FIGS. 5LA to 5LC, an $N^+$ layer 32 (which is an example of "second impurity layer" and "third impurity layer" in the claims) is formed by selective epitaxial crystal growth.

Subsequently, as illustrated in FIGS. 5MA to 5MC, a $SiO_2$ layer 34 is formed on the $N^+$ layer 32 and the fourth insulating layer 17a. Then, a contact hole 35 is formed in the $SiO_2$ layer 34 on the $N^+$ layer 32. Then, a metal wiring layer 36 connected to the $N^+$ layer 32 through the contact hole 35 and extending in the line Y-Y' direction is formed. The $N^+$ layer 12a is connected to the source line SL, the doped poly-Si layer 26aa is connected to the first plate line PL1, the doped poly-Si layer 26ba is connected to the second plate line PL2, the doped poly-Si layer 26ca is connected to the word line WL, and the metal wiring layer 36 is connected to the bit line BL. In this manner, the dynamic flash memory is formed on the P-layer substrate 11.

Note that the Si pillar 22 may also be formed of another semiconductor layer. In addition, the doped poly-Si layers 26a and 26b may be formed of a conductor layer of another metal or alloy.

The first insulating layer 13, the second insulating layer 15a, the third insulating layer 15b, and the fourth insulating layer 17 may be formed of an insulating layer of a single layer or a multi-layer of a $SiO_2$ layer, a SiN layer, or an alumina ($Al_2O_3$) layer. In addition, since the fifth insulating layer 28 has a function of protecting the top portion of the Si pillar 22 from RIE as illustrated in FIGS. 5GA to 5GC, another material layer, not only the insulating layer, may also be used.

Furthermore, the fourth insulating layer 17 and the material layer 18 may also be formed of a single insulating layer. In this case, in the step of exposing the top portion of the Si pillar 22 in FIGS. 5KA to 5KC, an insulating layer with a thickness corresponding to the thickness of the fourth insulating layer 17 needs to be left.

The $N^+$ layer 12a is formed by heat treatment in the step in FIGS. 5DA to 5DC. However, the $N^+$ layer 12a may also be formed in any of steps after the formation of the Si pillar 22. In addition, although an $N^+$ layer is not formed on the top portion of the Si pillar 22 in the step in FIGS. 5LA to 5LC, an $N^+$ layer may be formed on the top portion of the Si pillar 22 by, for example, additional heat treatment, ion implantation, low-temperature plasma doping, or the like. Furthermore, if the $N^+$ layer is formed on the top portion of the Si pillar 22, the $N^+$ layer 32 may or may not be formed by selective epitaxial crystal growth.

Although the Si pillar 22 is formed by epitaxial crystal growth in FIGS. 5EA to 5EC, but may also be formed by another method such as molecular beam epitaxy, atomic layer deposition (ALD), metal induced lateral crystallization (MILC), or metal-assisted solid-phase crystallization process (MSCP), or by some methods in combination.

In FIGS. 5GA to 5GC, the doped poly-Si layers 26a, 26b, and 26c are formed to surround the entire Si pillar 22 in plan view. However, each of the doped poly-Si layers 26a, 26b, and 26c may also be formed to be divided into two parts in plan view. For example, the hole 20 is formed close to an adjacent hole (not illustrated) in the line X-X' direction. Then, in the formation of the $SiO_2$ layers 25a, 25b, and 25c in FIGS. 5FA to 5FC, the $SiO_2$ layers 25a, 25b, and 25c are formed to be in contact with a $SiO_2$ layer (not illustrated) surrounding an adjacent Si pillar 22 (not illustrated). Thus, the doped poly-Si layers 26a, 26b, and 26c can be isolated in the line Y-Y' direction and can extend in the line X-X' direction. In this case, dynamic flash memory operations can be performed by driving, synchronously or asynchronously, divided conductor layers connected to the first plate line PL1, the second plate line PL2, or the word line WL. In addition, in FIGS. 5IA to 5IC, a slit extending in the line X-X' direction may be formed in the fifth insulating layer 28a, the material layer 18a, and the fourth insulating layer 17a, and then, the doped poly-Si layers 26aa, 26ba, and 26ca may be etched to divide the conductor layers to be connected to the first plate line PL1, the second plate line PL2, and the word line WL.

An embedded conductor layer such as a W layer may also be provided on the periphery of the $N^+$ layer 12a in FIGS. 5AA to 5MC. In addition, a metal wiring layer connected to the $N^+$ layer 12a may be provided on the periphery of the block region of memory cells arranged two-dimensionally, and may be connected to the source line SL.

In addition, the dynamic flash memory operations are performed also in a structure in which the polarities of the conductivity types of the $N^+$ layers 3a and 3b and the P layer 7 in FIG. 1 are reversed. In this case, the majority carriers in the Si pillar 2 are electrons. Therefore, a group of electrons generated by impact ionization is stored in the channel region 7a, and the "1" state is set. The same applies to FIGS. 5AA to 5MC.

The dynamic flash memory element may have any structure that satisfies the condition that the group of holes 10 generated by the impact ionization phenomenon are retained in the channel region 7a. For this, the channel region 7a may have a floating body structure isolated from the substrate 1. Thus, the above-mentioned dynamic flash memory operations can be performed if, for example, the semiconductor base of the channel region is formed horizontally to the substrate 1 by using a GAA (Gate All Around: refer to, for example, J. Y. Song, W. Y. Choi, J. H. Park, J. D. Lee, and B-G. Park: "Design Optimization of Gate-All-Around (GAA) MOSFETs," IEEE Transactions on Nanotechnology, vol. 5, no. 3, pp. 186-191, May 2006) technology and a Nanosheet technology (refer to, for example, N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017), which types of SGTs. In addition, a device structure (refer to, for example, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)) using an SOI may also be used. In this device structure, the bottom portion of the channel region is in contact with the insulating layer of the SOI substrate, and other portions of the channel region are surrounded by a gate insulating layer and an element isolation insulating layer. Also in this structure, the channel region has a floating body structure. In this manner, in the dynamic flash memory element provided by the present embodiment, the condition that the channel region has a floating body structure may be satisfied. Furthermore, also with a structure in which a Fin transistor (refer to, for example, H. Jiang, N. Xu, B. Chen, L. Zeng, Y. He, G. Du, X. Liu and X. Zhang: "Experimental investigation of self heating effect (SHE) in multiple-fin SOI FinFETs," Semicond. Sci. Technol. 29 (2014) 115021 (7pp)) is formed on the SOI substrate, as long as the channel region has a floating body structure, the dynamic flash operations can be performed. Alternatively, GAA or Nanosheet elements can be stacked in multiple stages to form a dynamic flash memory element. Alternatively, dynamic flash memory cells, each of which is the dynamic flash memory cell illustrated in FIG. 1, can be stacked in multiple stages to form a dynamic flash memory element.

In the memory erase operation, a first PN junction between the channel region 7a and the N$^+$ layer 3a and a second PN junction between the channel region 7a and the N$^+$ layer 3b can be kept in a reverse bias state, and the voltage of the first gate conductor layer 5a can be lower than the voltage of the second gate conductor layer 5b. Accordingly, a drift electric field that moves the group of holes 10 toward the N$^+$ layer 3a occurs in the channel region 7a near the boundary between the first gate conductor layer 5a and the second gate conductor layer 5b. The memory erase operation may be performed by using this operation.

In FIGS. 5MA to 5MC, the N$^+$ layer 12a is connected to the source line SL, the doped poly-Si layer 26aa is connected to the first plate line PL1, the doped poly-Si layer 26ba is connected to the second plate line PL2, and the doped poly-Si layer 26ca is connected to the word line WL. However, the N$^+$ layer 12a may be connected to the source line SL, the doped poly-Si layer 26aa may be connected to the first plate line PL1, the doped poly-Si layer 26ba may be connected to the word line WL, and the doped poly-Si layer 26ca may be connected to the second plate line PL2. In this case, the coupling capacitance between the doped poly-Si layer 26ba connected to the word line WL and the metal wiring layer 36 connected to the bit line BL can be reduced. Similarly, the coupling capacitance between the doped poly-Si layer 26ba connected to the word line WL and the N$^+$ layer 12a connected to the source line SL can be reduced. In addition, in the erase operation, for example, by making the voltage of the word line WL higher than that of the first plate line PL1 and the second plate line PL2, the group of holes can be discharged to the source line SL and the bit line BL at a high speed.

In FIG. 1, any or all of the first gate conductor layer 5a, the second gate conductor layer 5b, and the third gate conductor layer 5c may be further divided in the vertical direction. In this case, the vertical-direction lengths of the first gate conductor layer 5a, the second gate conductor layer 5b, and the third gate conductor layer 5c, any or all of which are divided, may be equal or different in accordance with operational optimization or manufacturing requirements.

The present embodiment offers the following features.
First Feature

When the dynamic flash memory cell performs a write or read operation, the voltage of the word line WL swings. At this time, the first and second plate lines PL1 and PL2 have a function of decreasing the capacitive coupling ratio between the word line WL and the channel region 7a. As a result, the influence of a change in the voltage of the channel region 7a when the voltage of the word line WL swings can be significantly suppressed. Thus, the difference between the threshold voltages of the MOS transistor region of the word line WL indicating logical "0" and "1" can be increased. In addition, this leads to an improvement in retention characteristics and disturbance characteristics. This leads to an increase in the operation margin of the dynamic flash memory cell.
Second Feature By connecting the second gate conductor layer 5b to the word line WL, the first gate conductor layer 5a to the first plate line PL1, and the third gate conductor layer 5c to the second plate line PL2, the word line WL is sandwiched between the upper second plate line PL2 and the lower first plate line PL1. Thus, the second gate conductor layer 5b connected to the word line WL can be separated away from the N$^+$ layer 3a connected to the source line SL and the N$^+$ layer 3b connected to the bit line BL. This can reduce the coupling capacitance between the word line WL and the bit line BL and between the word line WL and the source line SL. Thus, the dynamic flash memory cell operations can be stabilized. In addition, in the erase operation, for example, by making the voltage of the word line WL higher than that of the first plate line PL1 and the second plate line PL2, the group of holes can be discharged to the source line SL and the bit line BL at a high speed.
Third Feature In this embodiment, the doped poly-Si layers 26aa and 26ba connected to the two first and second plate lines PL1 and PL2 are formed to be isolated from each other by the second insulating layer 15aa. If the doped poly-Si layers 26a, 26b, and 26c have equal thicknesses, the capacitance between the Si pillar 22 serving as a channel and the doped poly-Si layer 26ca connected to the word line WL is half the capacitance between the Si pillar 22 serving as a channel and the doped poly-Si layers 26aa and 26ba connected to the first and second plate lines PL1 and PL2. As a result, the influence of a change in the voltage of the channel region 7a when the voltage of the word line WL swings can be significantly suppressed. In addition, in the step of embedding the doped poly-Si layers 26a, 26b, and 26c in the holes 23a, 23b, and 23c in FIGS. 5FA to 5GC, by making the vertical-direction lengths of the holes 23a, 23b, and 23c substantially equal, the uniform doped poly-Si layers 26a, 26b, and 26c can be embedded. For example, if the second insulating layer 15a is omitted and the doped poly-Si layers 26a and 26b are formed of a single doped poly-Si layer, the hole 23c for the word line WL and a hole (not illustrated) for the plate line have different volumes. Thus, if the doped poly-Si layer is embedded in one of the holes optimally, voids may be generated in the doped poly-Si layer embedded in the other hole. This embodiment can prevent occurrence of such a problem more easily. Thus, in addition to the increase in the operation margin of the dynamic flash memory cell, manufacture is easier.
Fourth Feature In the manufacturing method of the dynamic flash memory, the doped poly-Si layers 26a and 26b to be connected to the first and second plate lines PL1 and PL2 and the doped poly-Si layer 26c to be connected to the word line WL are defined by the thicknesses of the SiN layers 14a, 14b, and 14c as illustrated in FIGS. 5AA to 5AC. For example, if the SiN layers 14a, 14b, and 14c are formed by CVD, the thicknesses thereof can be controlled with high precision by controlling the deposition time. Thus, variations of change in the voltage of the channel region 7a can be reduced, and as a result, the operation margin can be increased.

Second Embodiment

Figure 6C:
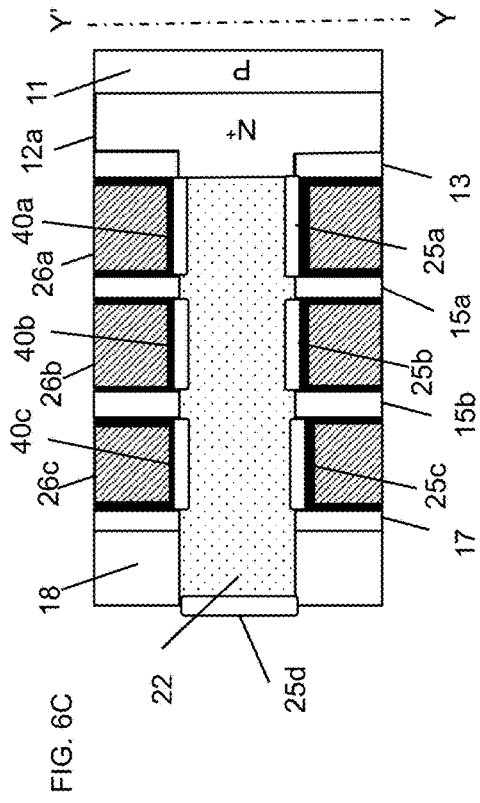
FIGS. 6A to 6C are diagrams for describing a manufacturing method of a semiconductor memory device according to a second embodiment.
Figure 6A:
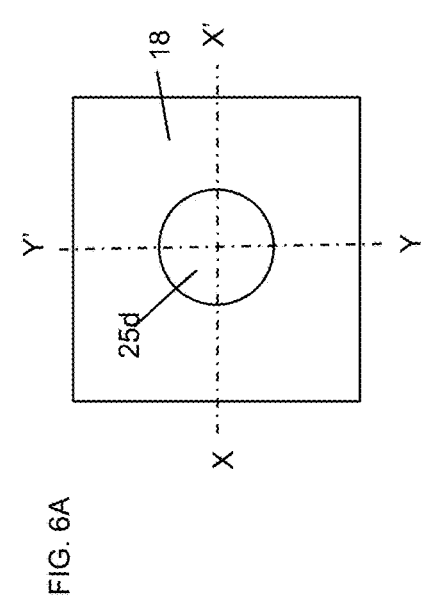
Figure 6B:
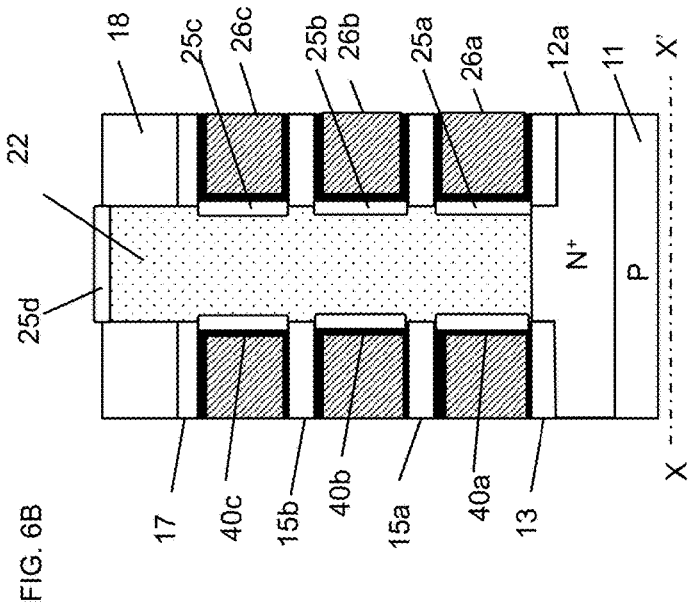
Figure 8A:
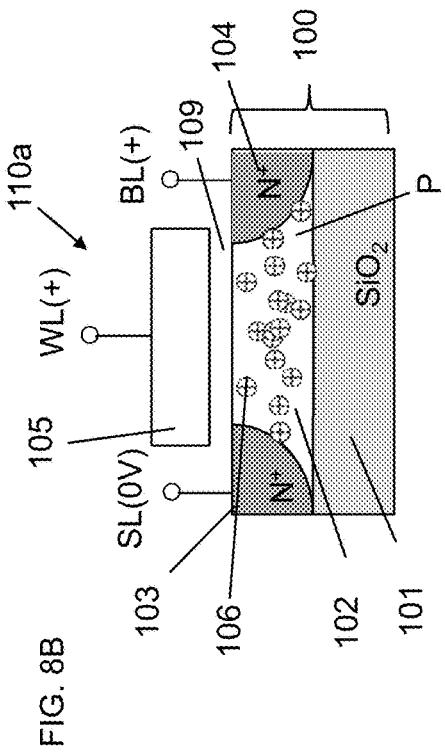
FIGS. 8A to 8D are diagrams for describing a write operation of a DRAM memory cell including no capacitor in the related art.
Figure 8B:
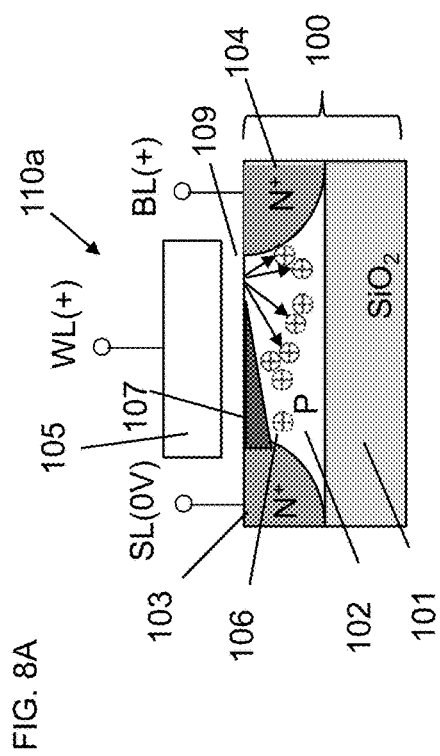
Figure 8C:
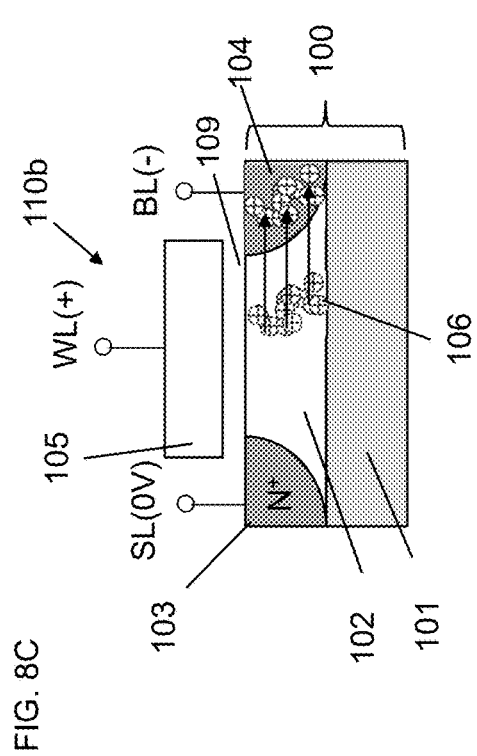
Figure 8D:
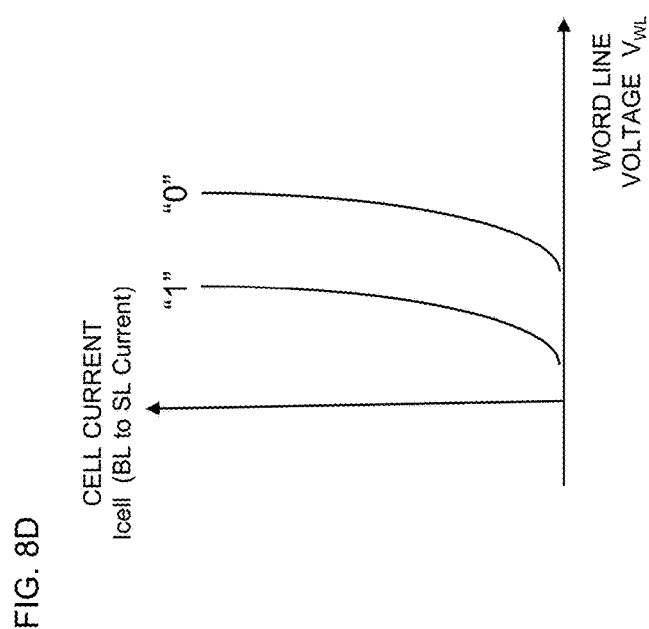
Figures 9A, 9B:
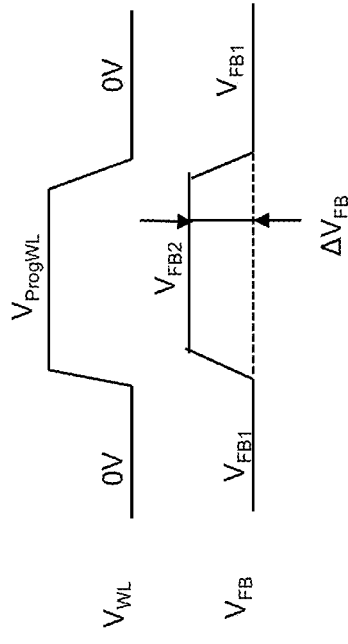
FIGS. 9A and 9B are diagrams for describing a problem of the operation of the DRAM memory cell including no capacitor in the related art.
Figure 10C:
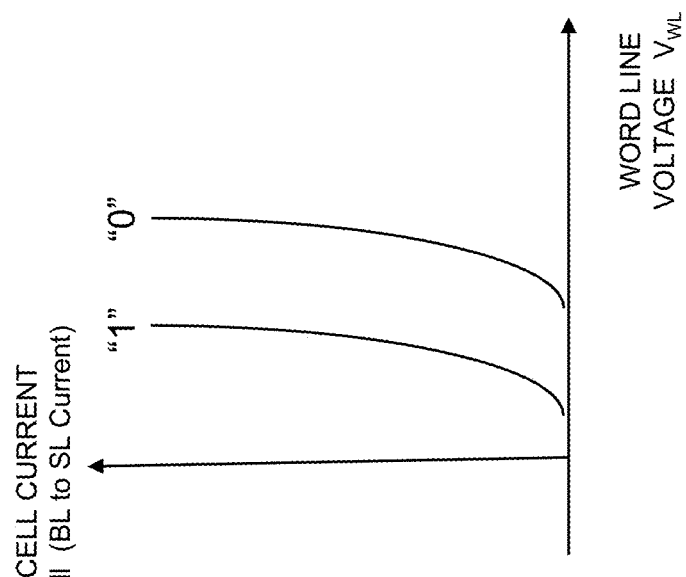
FIGS. 10A to 10C are diagrams for describing a read operation of the DRAM memory cell including no capacitor in the related art.
Figure 10A:
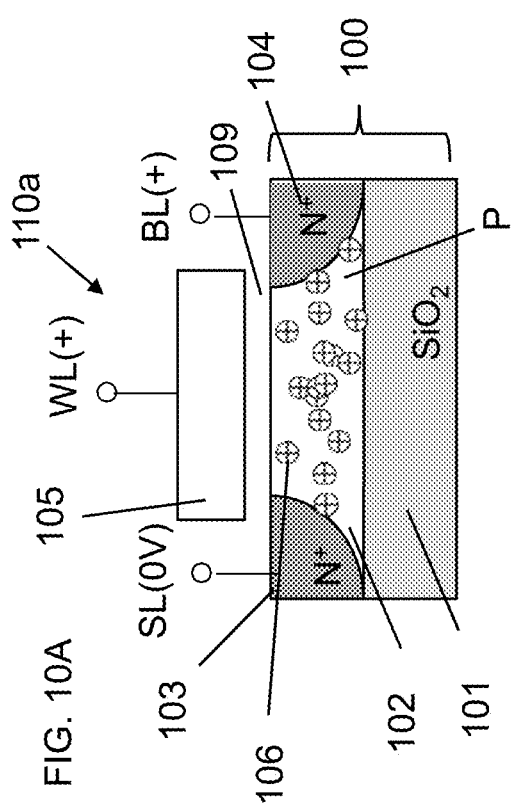
Figure 10B:
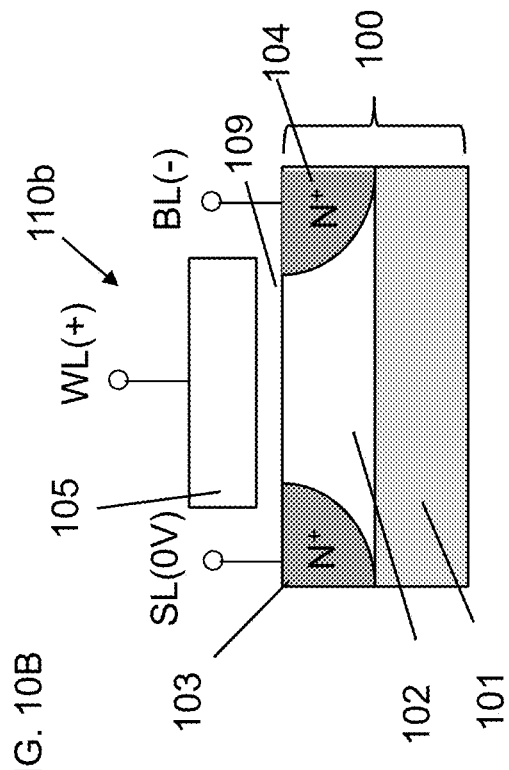

A manufacturing method of a semiconductor memory device according to a second embodiment will be described with reference to FIGS. 6A to 6C. FIG. 6A is a plan view of a single memory cell of the semiconductor memory device. FIG. 6B is a sectional view taken along line X-X' in FIG. 6A. FIG. 6C is a sectional view taken along line Y-Y' in FIG. 6A. A large number of such memory cells are arranged two-dimensionally in an actual memory device.

Substantially the same steps as those in FIGS. 5AA to 5FC are performed. Then, after the $SiO_2$ layers 25a, 25b, and 25c are formed, as illustrated in FIGS. 6A to 6C, in the holes 23a, 23b, and 23c, for example, hafnium oxide ($HfO_2$) layers 40a, 40b, and 40c (which are each an example of "fourth gate insulating layer" in the claims) are formed by ALD. Subsequently, the doped poly-Si layers 26a, 26b, and 26c are formed. Subsequently, substantially the same steps as those in FIGS. 5HA to 5MC are performed. In this manner, the dynamic flash memory is formed on the P-layer substrate 11. Note that the $HfO_2$ layers 40a, 40b, and 40c may be formed of another insulating material layer of a single layer or a multi-layer as long as the function of the gate insulating layer is implemented. In addition, the doped poly-Si layers 26a, 26b, and 26c may be formed of a conductor layer of another metal or alloy.

The present embodiment offers the following features.

As illustrated in FIGS. 5AA to 5MC, if the gate insulating layers are formed only of the $SiO_2$ layers 25a, 25b, and 25c, the $SiO_2$ layers 25a, 25b, and 25c are thick, and an effective diameter of the Si pillar 22 serving as a channel is small. Thus, the volume of the channel storing the group of holes, which are a signal, decreases, which leads to a decrease in the operation margin. In contrast, in this embodiment, by forming the $HfO_2$ layers 40a, 40b, and 40c in the outer sides of the $SiO_2$ layers 25a, 25b, and 25c, the decrease in the diameter of the Si pillar 22 can be suppressed, and a predetermined capacitance of the gate insulating layers can be formed.

Third Embodiment

A manufacturing method of a semiconductor memory device according to a third embodiment will be described with reference to FIGS. 7AA to 7BC. FIGS. 7AA and 7BA are plan views of a single memory cell of the semiconductor memory device. FIGS. 7AB and 7BB are sectional views taken along line X-X' in FIGS. 7AA and 7BA. FIGS. 7AC and 7BC are sectional views taken along line Y-Y' in FIGS. 7AA and 7BA. A large number of such memory cells are arranged two-dimensionally in a memory cell region in an actual memory device.

Substantially the same steps as those in FIGS. 5AA to 5HC are performed. Subsequently, as illustrated in FIGS. 7AA to 7AC, by using the material layer 18a and the fifth insulating layer 28a as etching masks, the fourth insulating layer 17 and the doped poly-Si layers 26b and 26c are etched to form the fourth insulating layer 17a, the doped poly-Si layer 26ba (which is an example of "second gate conductor layer" in the claims), and the doped poly-Si layer 26ca. In this case, the doped poly-Si layer 26a is not etched and is left to be continuous with the doped poly-Si layer 26a of an adjacent Si pillar (not illustrated).

Subsequently, substantially the same steps as those in FIGS. 5JA to 5KC are performed. Subsequently, as illustrated in FIGS. 7BA to 7BC, an $N^+$ layer 41 is formed on the top portion of the Si pillar 22 by, for example, plasma doping. Subsequently, substantially the same steps as those in FIGS. 5LA to 5MC are performed. Thus, while the doped poly-Si layer 26aa connected to the first plate line PL1 in FIGS. 5MA to 5MC in the first embodiment has the same shape as the doped poly-Si layer 26ca connected to the word line WL in plan view, in this embodiment, as illustrated in FIGS. 5BA to 7BC, the doped poly-Si layer 26a connected to the first plate line PL1 is not etched and is left to be continuous with the doped poly-Si layer 26a of an adjacent Si pillar (not illustrated). In this manner, the dynamic flash memory is formed on the P-layer substrate 11.

Note that the doped poly-Si layer 26a connected to the first plate line PL1 is externally connected in a peripheral portion of the memory cell region. In this case, although it is necessary to form a contact hole, a wiring metal layer, and the like, they can be formed more easily than in the memory cell region.

The present embodiment offers the following features.

First Feature

In this embodiment, an etching process for the doped poly-Si layer 26a connected to the first plate line PL1 is unnecessary in the memory cell region. Thus, the dynamic flash memory can be manufactured more easily.

Second Feature

In FIGS. 7AA to 7AC, the doped poly-Si layer 26ba connected to the second plate line PL2 has the same shape as the doped poly-Si layer 26ca connected to the word line WL in plan view. However, in the etching process using the material layer 18a and the fifth insulating layer 28a as etching masks, the doped poly-Si layer 26b is not necessarily etched. In this case, the doped poly-Si layer 26b connected to the second plate line PL2 has the same shape as the doped poly-Si layer 26a connected to the first plate line PL1. Also in this manner, the dynamic flash memory is formed on the P-layer substrate 11. In this case, an etching process for the doped poly-Si layers 26a and 26b is unnecessary in the memory cell region. Thus, the dynamic flash memory can be manufactured more easily.

Other Embodiments

In FIG. 1, the gate lengths of the first gate conductor layer 5a and the second gate conductor layer 5b are made greater than the gate length of the third gate conductor layer 5c so that the gate capacitances of the first gate conductor layer 5a connected to the first plate line PL1 and the second gate conductor layer 5b connected to the second plate line PL2 can be greater than the gate capacitance of the third gate conductor layer 5c connected to the word line WL. However, instead of making the gate lengths of the first gate conductor layer 5a and the second gate conductor layer 5b greater than the gate length of the third gate conductor layer 5c, the thicknesses of the first gate insulating layer 4a and the second gate insulating layer 4b may be made smaller than the thickness of the third gate insulating layer 4c. Alternatively, the permittivity of the first gate insulating layer 4a and the second gate insulating layer 4b may be made higher than the permittivity of the third gate insulating layer 4c. Furthermore, by using any of the lengths of the first gate conductor layer 5a, the second gate conductor layer 5b, and the third gate conductor layer 5c, and the thicknesses and permittivity of the first gate insulating layer 4a, the second gate insulating layer 4b, and the third gate insulating layer 4c in combination, the gate capacitances of the first gate conductor layer 5a and the second gate conductor layer 5b may be made greater than the gate capacitance of the third gate conductor layer 5c. The same applies to the other embodiments.

In FIG. 1, the vertical-direction lengths of the first gate conductor layer 5a and the second gate conductor layer 5b are made greater than the vertical-direction length of the third gate conductor layer 5c connected to the word line WL so that $C_{PL} > C_{WL}$ can be satisfied. However, addition of the first gate conductor layer 5a and the second gate conductor layer 5b suffices to decrease the capacitive coupling ratio ($C_{WL}(C_{PL}+C_{WL}+C_{BL}+C_{SL})$) of the word line WL to the channel region 7a. As a result, the potential change $\Delta V_{FB}$ of the channel region 7a of the floating body decreases. The same applies to the other embodiments.

As the voltage of the first plate line PL1 and the voltage of the second plate line PL2 in the description of the embodiments, for example, a fixed voltage may be applied to both or one of the first plate line PL1 and the second plate line PL2 regardless of the operation mode. In addition, as the voltage of the first plate line PL1 and the voltage of the second plate line PL2, for example, 0 V may be applied only at the time of an erase operation. Furthermore, as the voltage of the first plate line PL1 and the voltage of the second plate line PL2, a fixed voltage or a temporally changing voltage may be applied as long as the voltage satisfies conditions for the dynamic flash memory operations.

The Si pillar 2 has a round shape in plan view in FIG. 1. However, the Si pillar 2 may have, for example, an elliptic shape or a shape elongated in one direction instead of a round shape. The same applies to the other embodiments.

A negative bias is applied to the source line SL at the time of the erase operation to discharge the group of holes in the channel region 7a, which is a floating body, as described in the embodiments. However, the erase operation may be performed on the basis of other voltage conditions.

In FIG. 1, an N-type impurity layer or a P-type impurity layer having a different acceptor impurity concentration may be disposed between the $N^+$ layer 3a and the P layer 7. In addition, an N-type impurity layer or a P-type impurity layer may be disposed between the $N^+$ layer 3b and the P layer 7. The same applies to the other embodiments.

The $N^+$ layers 3a and 3b in FIG. 1 may be formed of Si or other semiconductor material layers containing a donor impurity. The $N^+$ layer 3a and the $N^+$ layer 3b may be formed of different semiconductor material layers. The same applies to the other embodiments.

The $N^+$ layer 41 is formed by plasma doping on the top portion of the Si pillar 22 in FIG. 7BA to 7BC. However, the $N^+$ layer 41 may also be formed by, for example, ion implantation, heat diffusion from the $N^+$ layer 32, another method using a push-out effect of a donor impurity from a silicide layer containing the donor impurity, or the like. The same applies to the other embodiments. Furthermore, if the $N^+$ layer 41 is formed, the $N^+$ layer 32 may be omitted.

Si pillars 22, each of which is the Si pillar 22 illustrated in FIGS. 5CA to 5MC, may be arranged two-dimensionally in a square lattice, a diagonal lattice, a honeycomb pattern, a zigzag pattern, or a serrated pattern. The same applies to the other embodiments.

Instead of the P-layer substrate 11 in FIG. 5AA to 5MC, SOI or a multilayer well may be used. The same applies to the other embodiments.

FIG. 1 illustrates an example in which each of the first gate conductor layer 5a, the second gate conductor layer 5b, and the third gate conductor layer 5c is formed of a single conductor material layer. However, each of the first gate conductor layer 5a, the second gate conductor layer 5b, and the third gate conductor layer 5c may be formed of a plurality of conductor layers. The same applies to the other embodiments.

Dynamic flash memory cells, each of which is the dynamic flash memory cell illustrated in FIG. 1, may be stacked in multiple stages in the vertical direction. The same applies to the other embodiments.

Various embodiments and modifications of the present invention are possible without departing from the broad spirit and scope of the present invention. The embodiments described above are illustrative examples of the present invention and do not limit the scope of the present invention. The embodiments and modifications can be appropriately combined. Furthermore, some of constituent features of the above embodiments may be omitted as required, and such embodiments still fall within the technical idea of the present invention.

According to the semiconductor memory device and the manufacturing method thereof according to the present invention, a high-density and high-performance dynamic flash memory can be obtained.

What is claimed is:

1. A semiconductor memory device comprising:
a semiconductor base on a substrate, the semiconductor base standing vertically or extending horizontally to the substrate;
a first impurity layer and a second impurity layer at both ends of the semiconductor base;
a first gate insulating layer, a second gate insulating layer, and a third gate insulating layer surrounding part or all of a side surface of the semiconductor base between the first impurity layer and the second impurity layer sequentially from the first impurity layer toward the second impurity layer, the first gate insulating layer being in contact with or in proximity to the first impurity layer, the second gate insulating layer surrounding part or all of the side surface of the semiconductor base and being connected to the first gate insulating layer, and the third gate insulating layer surrounding part or all of the side surface of the semiconductor base, being connected to the second gate insulating layer, and being in contact with or in proximity to the second impurity layer;
a first gate conductor layer covering the first gate insulating layer;
a second gate conductor layer covering the second gate insulating layer;
a third gate conductor layer covering the third gate insulating layer;
a second insulating layer between the first gate conductor layer and the second gate conductor layer; and
a third insulating layer between the second gate conductor layer and the third gate conductor layer, wherein
the semiconductor memory device performs a memory write operation by performing an operation in which voltages to be applied to the first impurity layer, the second impurity layer, the first gate conductor layer, the second gate conductor layer, and the third gate conductor layer are controlled to cause an impact ionization phenomenon in the semiconductor base with a current flowing between the first impurity layer and the second impurity layer, an operation in which, out of a group of electrons or holes that are generated, the group of electrons is removed from the first impurity layer or the second impurity layer, and an operation in which part or all of the group of holes is left in the semiconductor base, and the semiconductor memory device performs a memory erase operation in which the voltages to be applied to the first impurity layer, the second impurity layer, the first gate conductor layer, the second gate conductor layer, and the third gate conductor layer are controlled to discharge a left group of holes of the group of holes from one or both of the first impurity layer and the second impurity layer.

2. The semiconductor memory device according to claim 1, wherein in the memory erase operation, a first PN junction between the semiconductor base and the first impurity layer and a second PN junction between the semiconductor base and the second impurity layer are kept in a reverse bias state, and a voltage of the first gate conductor layer is lower than a voltage of the second gate conductor layer.

3. The semiconductor memory device according to claim 1, wherein when one of the first impurity layer and the second impurity layer is connected to a source line, an other of the first impurity layer and the second impurity layer is connected to a bit line, and when one or two of the first gate conductor layer, the second gate conductor layer, and the third gate conductor layer are connected to a plate line, two others or an other of the first gate conductor layer, the second gate conductor layer, and the third gate conductor layer is connected to a word line.

4. The semiconductor memory device according to claim 3, wherein a first gate capacitance is greater than a second gate capacitance, the first gate capacitance being a gate capacitance between the semiconductor base and one or more of the first gate conductor layer, the second gate conductor layer, and the third gate conductor layer connected to the plate line, and the second gate capacitance being a gate capacitance between the semiconductor base and one or more of the first gate conductor layer, the second gate conductor layer, and the third gate conductor layer connected to the word line.

5. The semiconductor memory device according to claim 1, wherein at least one of the first gate conductor layer, the second gate conductor layer, and the third gate conductor layer is formed to be divided into a plurality of parts in a vertical direction.

6. The semiconductor memory device according to claim 1, wherein at least one of the first gate conductor layer, the second gate conductor layer, and the third gate conductor layer is formed to be divided into a plurality of parts on a horizontal cross section.

7. The semiconductor memory device according to claim 1, wherein vertical-direction lengths of the first gate conductor layer, the second gate conductor layer, and the third gate conductor layer are formed to be equal.

* * * * *